(12) United States Patent
Eid et al.

(10) Patent No.: US 11,990,448 B2
(45) Date of Patent: May 21, 2024

(54) DIRECT BONDING IN MICROELECTRONIC ASSEMBLIES

(71) Applicant: Intel Corporation, Santa Clara, CA (US)

(72) Inventors: Feras Eid, Chandler, AZ (US); Adel A. Elsherbini, Tempe, AZ (US); Aleksandar Aleksov, Chandler, AZ (US); Shawna M. Liff, Scottsdale, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 709 days.

(21) Appl. No.: 17/025,709

(22) Filed: Sep. 18, 2020

(65) Prior Publication Data
US 2022/0093561 A1 Mar. 24, 2022

(51) Int. Cl.
*H01L 25/065* (2023.01)
*H01L 23/00* (2006.01)

(52) U.S. Cl.
CPC .......... *H01L 25/0655* (2013.01); *H01L 24/06* (2013.01); *H01L 24/08* (2013.01);
(Continued)

(58) Field of Classification Search
CPC ............ H01L 25/0655; H01L 25/0652; H01L 25/0657; H01L 24/08; H01L 24/09;
(Continued)

(56) References Cited

U.S. PATENT DOCUMENTS

| 6,465,892 B1 | 10/2002 | Suga |
| 7,078,811 B2 | 7/2006 | Suga |

(Continued)

FOREIGN PATENT DOCUMENTS

| DE | 102019115275 A1 | 1/2020 |
| EP | 3594994 A1 | 1/2020 |

(Continued)

OTHER PUBLICATIONS

Han, Tiancheng, et al., "Manipulating Steady Heat Conduction by Sensu-shaped Thermal Metamaterials," Scientific Reports, May 14, 2005; 7 pages.

*Primary Examiner* — Alonzo Chambliss
(74) *Attorney, Agent, or Firm* — Akona IP PC

(57) ABSTRACT

Disclosed herein are microelectronic assemblies including direct bonding, as well as related structures and techniques. For example, in some embodiments, a microelectronic assembly may include a first microelectronic component and a second microelectronic component coupled to the first microelectronic component by a direct bonding region, wherein the direct bonding region includes a first subregion and a second subregion, and the first subregion has a greater metal density than the second subregion. In some embodiments, a microelectronic assembly may include a first microelectronic component and a second microelectronic component coupled to the first microelectronic component by a direct bonding region, wherein the direct bonding region includes a first metal contact and a second metal contact, the first metal contact has a larger area than the second metal contact, and the first metal contact is electrically coupled to a power/ground plane of the first microelectronic component.

18 Claims, 18 Drawing Sheets

(52) U.S. Cl.
CPC .............. *H01L 24/09* (2013.01); *H01L 24/17* (2013.01); *H01L 24/29* (2013.01); *H01L 24/30* (2013.01); *H01L 25/0652* (2013.01); *H01L 2224/08225* (2013.01); *H01L 2224/09177* (2013.01); *H01L 2224/81* (2013.01)

(58) Field of Classification Search
CPC ............... H01L 24/05; H01L 24/06; H01L 2224/08225; H01L 2224/09177; H01L 24/29; H01L 24/16; H01L 24/17; H01L 24/30
See application file for complete search history.

(56) References Cited

U.S. PATENT DOCUMENTS

| | | | |
|---|---|---|---|
| 7,217,631 | B2 | 5/2007 | Suga |
| 8,778,773 | B2 | 7/2014 | Sadaka |
| 8,792,034 | B2 | 7/2014 | Takahashi |
| 8,896,125 | B2 | 11/2014 | Kagawa et al. |
| 9,799,587 | B2 | 10/2017 | Fujii et al. |
| 10,236,238 | B2 | 3/2019 | Fujii et al. |
| 10,818,650 | B2 | 10/2020 | Iida et al. |
| 11,158,573 | B2 | 10/2021 | Uzoh et al. |
| 11,462,270 | B2 | 10/2022 | Park et al. |
| 11,682,656 | B2 * | 6/2023 | Yen .......................... H01L 23/13 257/668 |
| 11,694,977 | B2 * | 7/2023 | Katz ....................... H01L 24/08 257/774 |
| 11,721,673 | B2 * | 8/2023 | Lee ..................... H01L 25/0657 257/737 |
| 11,764,177 | B2 * | 9/2023 | Haba ................... H01L 23/3121 257/773 |
| 2010/0233850 | A1 | 9/2010 | Patti et al. |
| 2013/0249532 | A1 | 9/2013 | Lin et al. |
| 2014/0239499 | A1 | 8/2014 | Okuyama |
| 2014/0284744 | A1 | 9/2014 | Fujii et al. |
| 2014/0362267 | A1 | 12/2014 | Kagawa et al. |
| 2015/0270209 | A1 | 9/2015 | Woychik et al. |
| 2015/0270212 | A1 | 9/2015 | Kagawa et al. |
| 2016/0155725 | A1 * | 6/2016 | Chen ........................ H01L 24/06 257/770 |
| 2016/0190103 | A1 * | 6/2016 | Kabe ..................... H01L 23/564 257/777 |
| 2016/0233203 | A1 * | 8/2016 | Chen ................... H01L 21/4846 |
| 2016/0343762 | A1 | 11/2016 | Kagawa et al. |
| 2019/0109042 | A1 | 4/2019 | Katkar et al. |
| 2019/0123006 | A1 | 4/2019 | Chen et al. |
| 2019/0157112 | A1 * | 5/2019 | Luo .......................... H01L 24/73 |
| 2019/0385977 | A1 | 12/2019 | Elsherbini et al. |
| 2020/0075556 | A1 | 3/2020 | Chen et al. |
| 2020/0126906 | A1 | 4/2020 | Uzoh et al. |
| 2020/0258857 | A1 | 8/2020 | Huo et al. |
| 2020/0266156 | A1 | 8/2020 | Lee |
| 2020/0279813 | A1 | 9/2020 | Liff et al. |
| 2021/0057373 | A1 | 2/2021 | Kim et al. |
| 2021/0320075 | A1 | 10/2021 | Hou et al. |
| 2022/0093492 | A1 * | 3/2022 | Elsherbini ............... H01L 23/49 |
| 2022/0093517 | A1 * | 3/2022 | Aleksov .............. H01L 23/5385 |
| 2022/0093725 | A1 | 3/2022 | Elsherbini ......... H01L 23/49811 |
| 2022/0189850 | A1 * | 6/2022 | Liff .................. H01L 23/49816 |
| 2022/0199546 | A1 * | 6/2022 | Elsherbini ......... H01L 23/49822 |
| 2023/0098931 | A1 | 3/2023 | Fujii et al. |

FOREIGN PATENT DOCUMENTS

| | | |
|---|---|---|
| WO | 2019132960 A1 | 7/2019 |
| WO | 2019132961 A1 | 7/2019 |

* cited by examiner

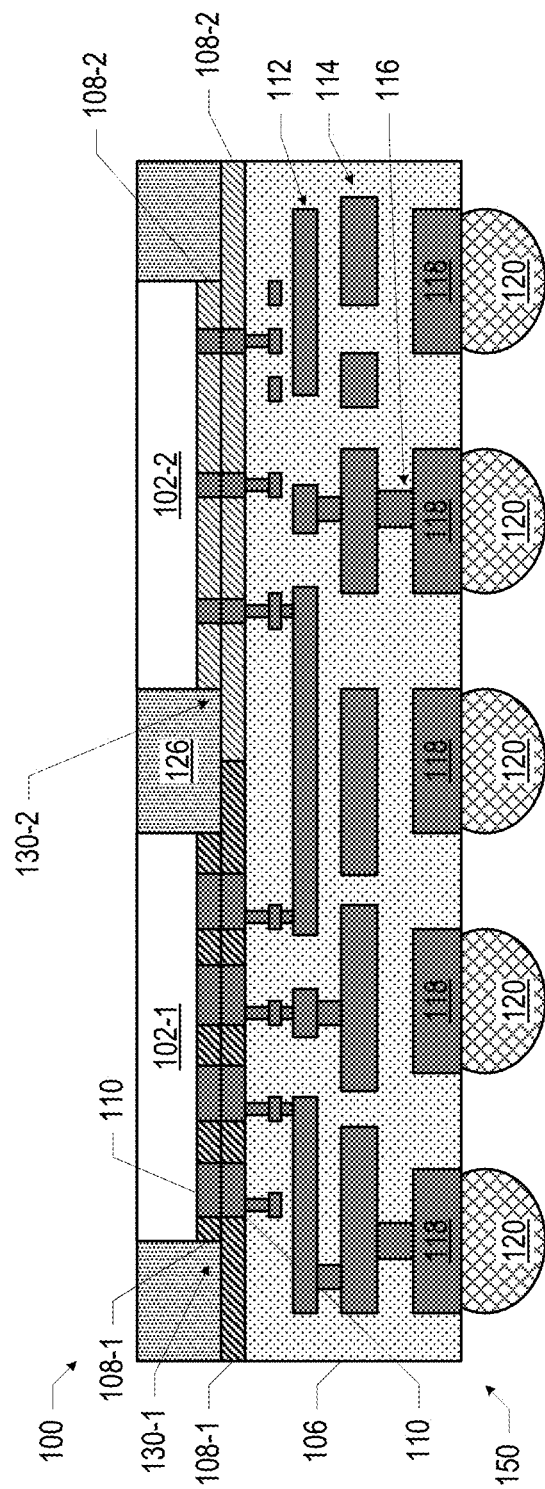
FIG. 20
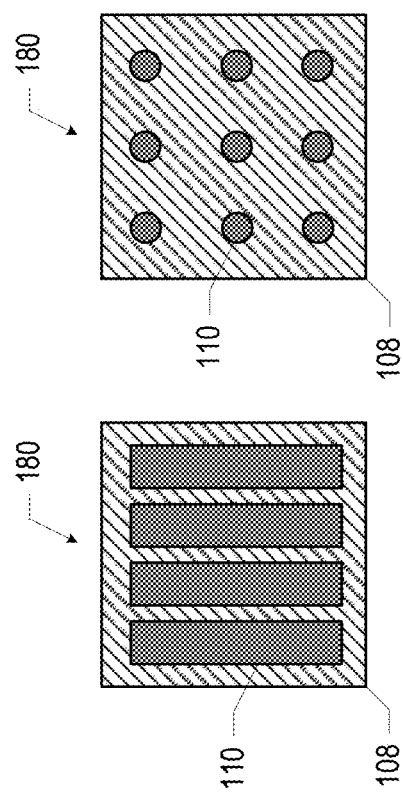
FIG. 21
FIG. 22

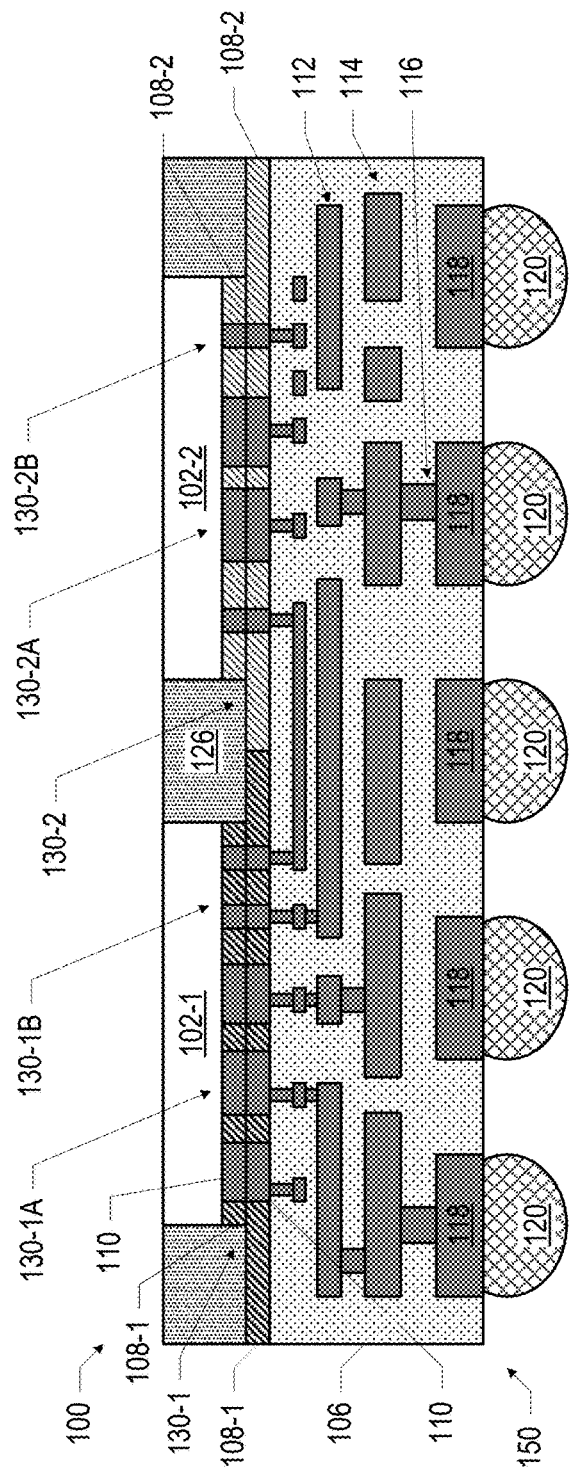
FIG. 23
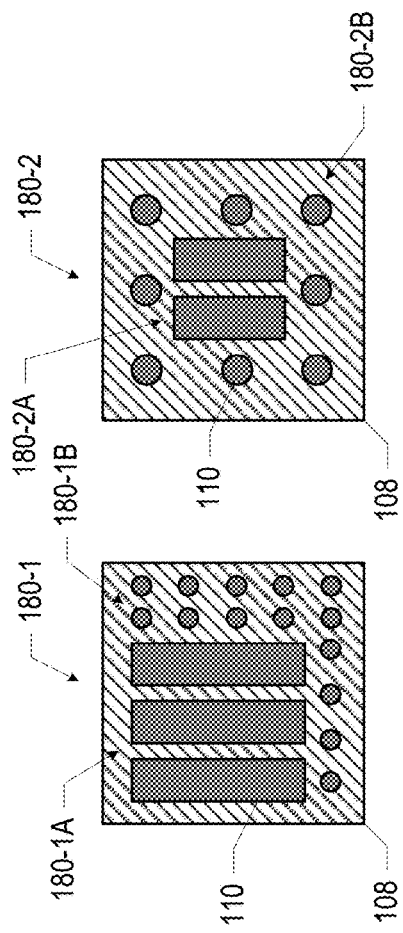
FIG. 24
FIG. 25

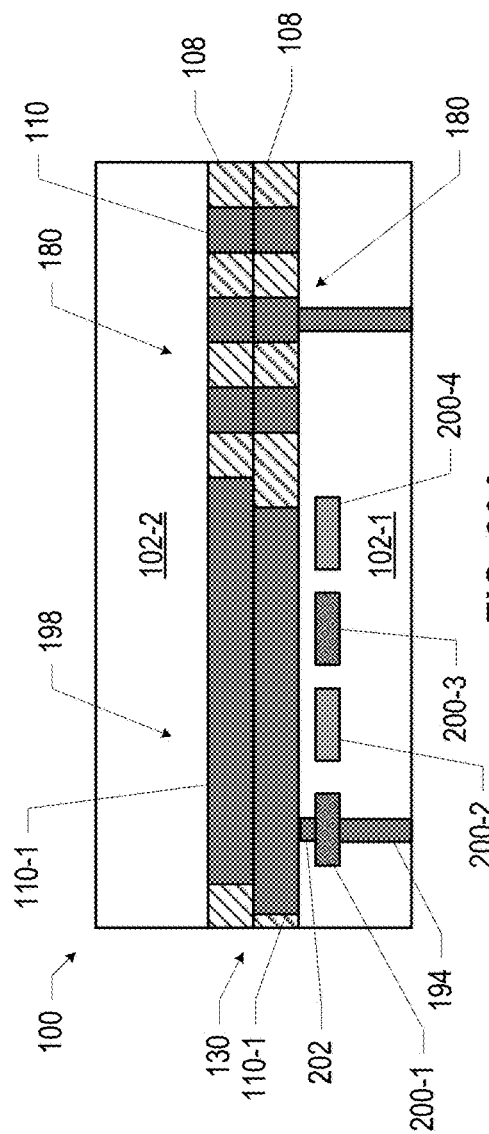
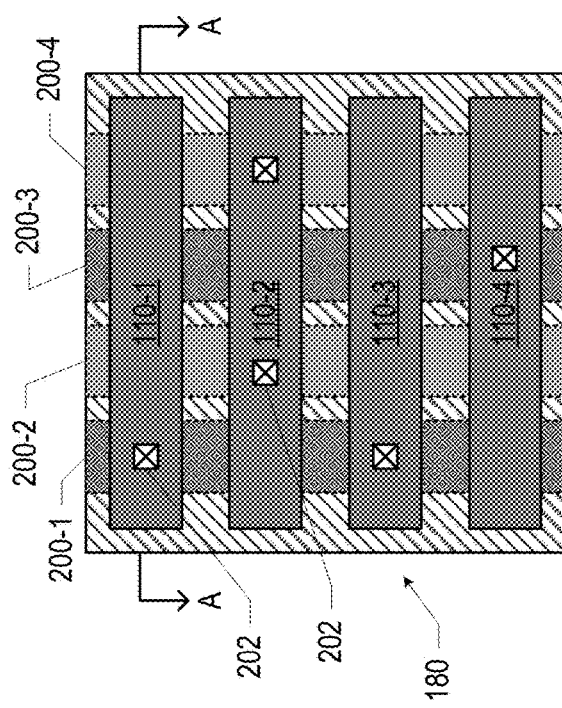
FIG. 29A
FIG. 29B

DIRECT BONDING IN MICROELECTRONIC ASSEMBLIES

BACKGROUND

An integrated circuit (IC) package typically includes a die wirebonded or soldered to a package substrate. In use, electrical signals and power are passed between the package substrate and the die through the wirebonds or solder.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 18-20 are side, cross-sectional views of example microelectronic assemblies including direct bonding, in accordance with various embodiments.

FIGS. 21-22 are top views of example direct bonding interfaces, in accordance with various embodiments.

FIG. 23 is a side, cross-sectional view of an example microelectronic assembly including direct bonding regions with multiple subregions, in accordance with various embodiments.

FIGS. 24-25 are top views of example direct bonding interfaces with multiple subregions, in accordance with various embodiments.

FIGS. 29A-29B are side, cross-sectional and top views, respectively, of an example portion of a microelectronic assembly with power/ground planes in a direct bonding region, in accordance with various embodiments.

DETAILED DESCRIPTION

Figure 1:
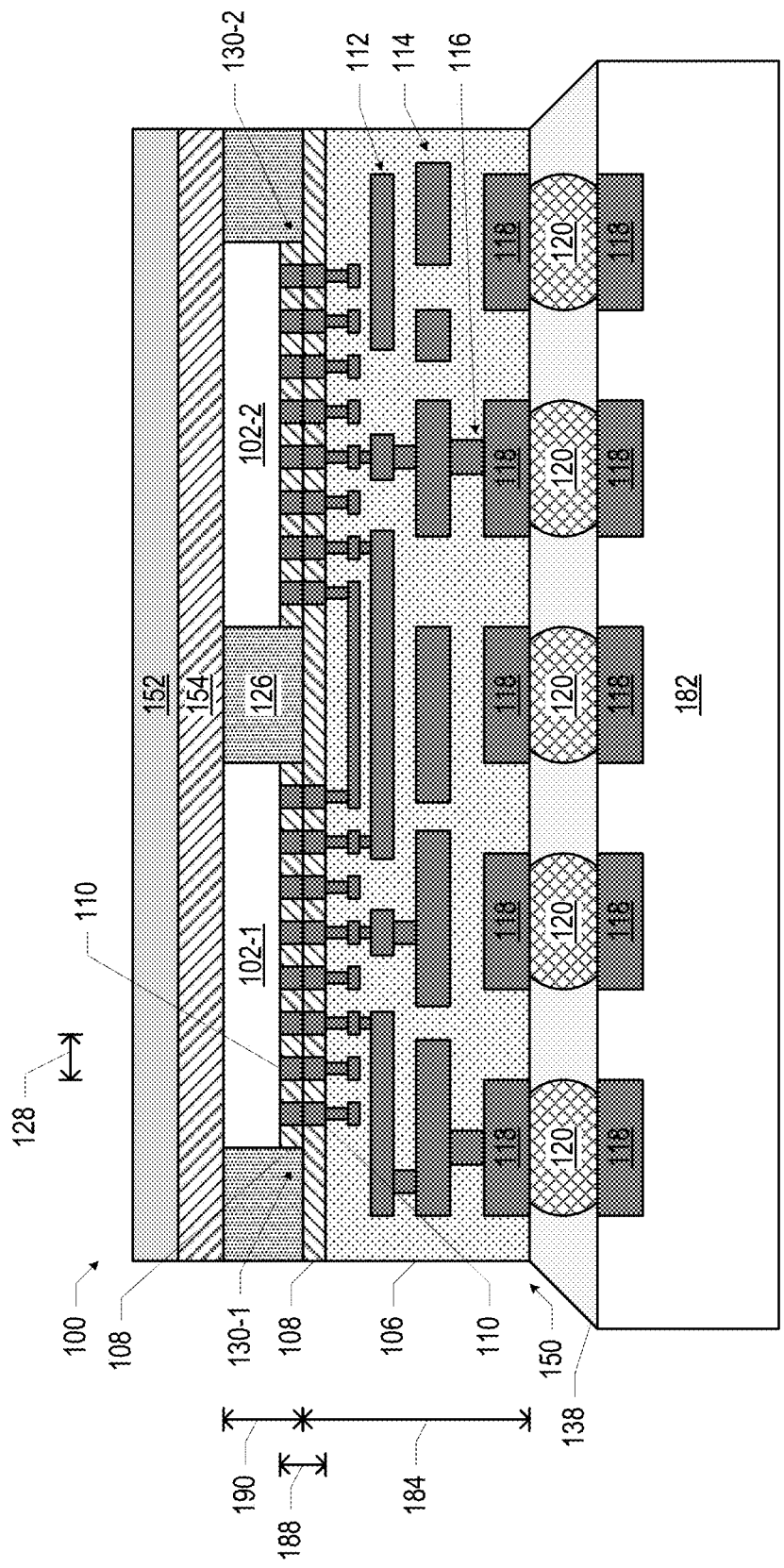
FIG. 1 is a side, cross-sectional view of an example microelectronic assembly including direct bonding, in accordance with various embodiments.

Disclosed herein are microelectronic assemblies including direct bonding, as well as related structures and techniques. For example, in some embodiments, a microelectronic assembly may include a first microelectronic component and a second microelectronic component coupled to the first microelectronic component by a direct bonding region, wherein the direct bonding region includes a first subregion and a second subregion, and the first subregion has a greater metal density than the second subregion. In some embodiments, a microelectronic assembly may include a first microelectronic component and a second microelectronic component coupled to the first microelectronic component by a direct bonding region, wherein the direct bonding region includes a first metal contact and a second metal contact, the first metal contact has a larger area than the second metal contact, and the first metal contact is electrically coupled to a power/ground plane of the first microelectronic component.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrases "A and/or B" and "A or B" mean (A), (B), or (A and B). For the purposes of the present disclosure, the phrases "A, B, and/or C" and "A, B, or C" mean (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. The terms "top," "bottom," etc. may be used herein to explain various features of the drawings, but these terms are simply for ease of discussion, and do not imply a desired or required orientation. Although certain elements may be referred to in the singular herein, such elements may include multiple sub-elements. For example, "a dielectric material" may include one or more dielectric materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

FIG. 1 is a side, cross-sectional view of a microelectronic assembly 100, in accordance with various embodiments. A number of elements are illustrated in FIG. 1 as included in the microelectronic assembly 100, but a number of these elements may not be present in a microelectronic assembly 100. For example, in various embodiments, the heat transfer structure 152, the thermal interface material (TIM) 154, the mold material 126, the microelectronic component 102-2, the underfill material 138, and/or the support component 182 may not be included. Further, FIG. 1 illustrates a number of elements that are omitted from subsequent drawings for ease of illustration, but may be included in any of the microelectronic assemblies 100 disclosed herein. Examples of such elements include the heat transfer structure 152, the TIM 154, the mold material 126, the microelectronic component 102-2, the underfill material 138, and/or the support component 182. Many of the elements of the microelectronic assembly 100 of FIG. 1 are included in other ones of the accompanying drawings; the discussion of these elements is not repeated when discussing these FIGS., and any of these elements may take any of the forms disclosed herein. In some embodiments, individual ones of the microelectronic assemblies 100 disclosed herein may serve as a system-in-package (SiP) in which multiple microelectronic components 102 having different functionality are included. In such embodiments, the microelectronic assembly 100 may be referred to as an SiP.

Figure 2:
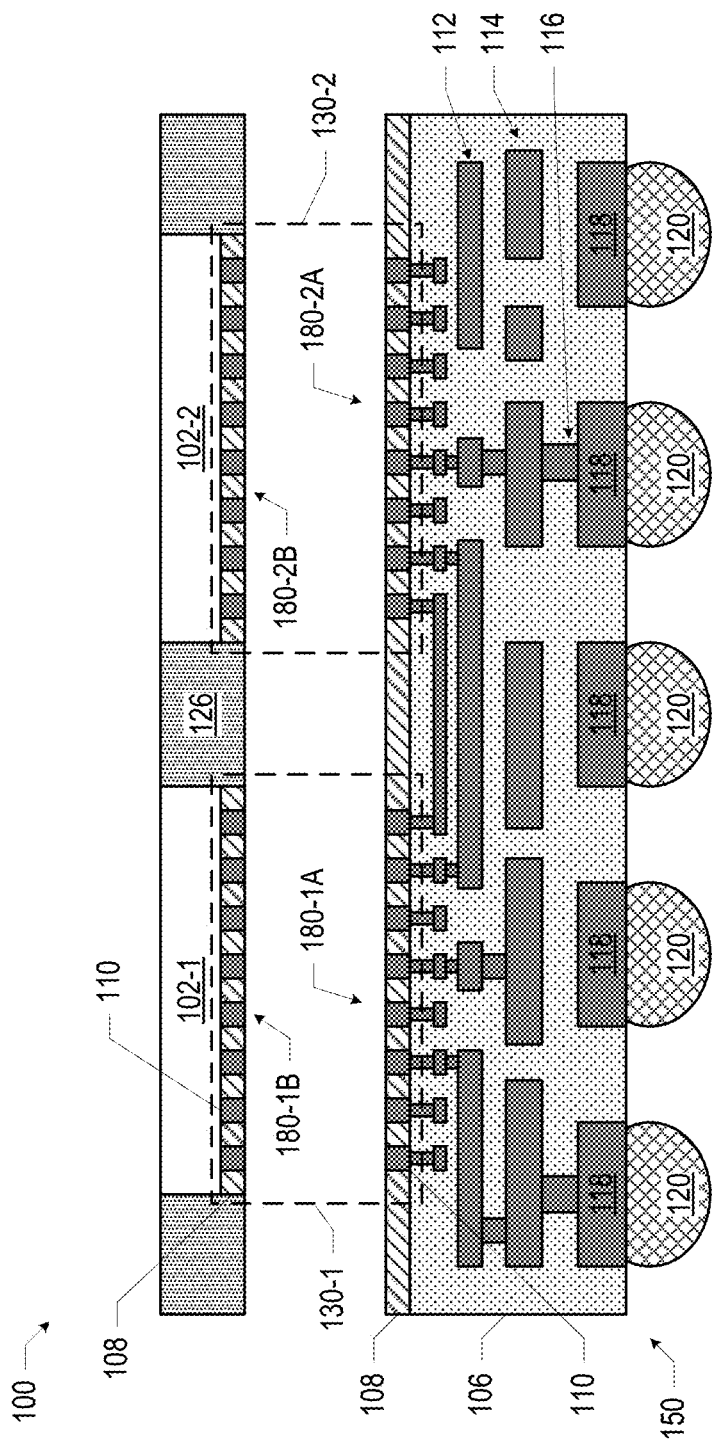
FIG. 2 is a side, cross-sectional exploded view of a portion of the microelectronic assembly of FIG. 1, in accordance with various embodiments.

The microelectronic assembly 100 may include an interposer 150 coupled to a microelectronic component 102-1 by a direct bonding (DB) region 130-1. In particular, as illustrated in FIG. 2, the DB region 130-1 may include a DB interface 180-1A at the top surface of the interposer 150, with the DB interface 180-1A including a set of conductive DB contacts 110 and a DB dielectric 108 around the DB contacts 110 of the DB interface 180-1A. The DB region 130-1 may also include a DB interface 180-1B at the bottom surface of the microelectronic component 102-1, with the DB interface 180-1B including a set of DB contacts 110 and a DB dielectric 108 around the DB contacts 110 of the DB interface 180-1B. The DB contacts 110 of the DB interface 180-1A of the interposer 150 may align with the DB contacts 110 of the DB interface 180-1B of the microelectronic component 102-1 so that, in the microelectronic assembly 100, the DB contacts 110 of the microelectronic component 102-1 are in contact with the DB contacts 110 of the interposer 150. In the microelectronic assembly 100 of FIG. 1, the DB interface 180-1A of the interposer 150 may be bonded (e.g., electrically and mechanically) with the DB interface 180-1B of the microelectronic component 102-1 to form the DB region 130-1 coupling the interposer 150 and the microelectronic component 102-1, as discussed further below. More generally, the DB regions 130 disclosed herein may include two complementary DB interfaces 180 bonded together; for ease of illustration, many of the subsequent drawings may omit the identification of the DB interfaces 180 to improve the clarity of the drawings.

As used herein, the term "direct bonding" is used to include metal-to-metal bonding techniques (e.g., copper-to-copper bonding, or other techniques in which the DB contacts 110 of opposing DB interfaces 180 are brought into contact first, then subject to heat and compression) and hybrid bonding techniques (e.g., techniques in which the DB dielectric 108 of opposing DB interfaces 180 are brought into contact first, then subject to heat and sometimes compression, or techniques in which the DB contacts 110 and the DB dielectric 108 of opposing DB interfaces 180 are brought into contact substantially simultaneously, then subject to heat and compression). In such techniques, the DB contacts 110 and the DB dielectric 108 at one DB interface 180 are brought into contact with the DB contacts 110 and the DB dielectric 108 at another DB interface 180, respectively, and elevated pressures and/or temperatures may be applied to cause the contacting DB contacts 110 and/or the contacting DB dielectrics 108 to bond. In some embodiments, this bond may be achieved without the use of intervening solder or an anisotropic conductive material, while in some other embodiments, a thin cap of solder may be used in a DB interconnect to accommodate planarity, and this solder may become an intermetallic compound (IMC) in the DB region 130 during processing. DB interconnects may be capable of reliably conducting a higher current than other types of interconnects; for example, some conventional solder interconnects may form large volumes of brittle IMGs when current flows, and the maximum current provided through such interconnects may be constrained to mitigate mechanical failure.

A DB dielectric 108 may include one or more dielectric materials, such as one or more inorganic dielectric materials. For example, a DB dielectric 108 may include silicon and nitrogen (e.g., in the form of silicon nitride); silicon and oxygen (e.g., in the form of silicon oxide); silicon, carbon, and nitrogen (e.g., in the form of silicon carbon nitride); carbon and oxygen (e.g., in the form of a carbon-doped oxide); silicon, oxygen, and nitrogen (e.g., in the form of silicon oxynitride); aluminum and oxygen (e.g., in the form of aluminum oxide); titanium and oxygen (e.g., in the form of titanium oxide); hafnium and oxygen (e.g., in the form of hafnium oxide); silicon, oxygen, carbon, and hydrogen (e.g., in the form of tetraethyl orthosilicate (TEOS)); zirconium and oxygen (e.g., in the form of zirconium oxide); niobium and oxygen (e.g., in the form of niobium oxide); tantalum and oxygen (e.g., in the form of tantalum oxide); and combinations thereof. Some particular embodiments of arrangements of DB dielectrics 108 including multiple dielectric materials are discussed below with reference to FIG. 4.

A DB contact 110 may include a pillar, a pad, or other structure. The DB contacts 110, although depicted in the accompanying drawings in the same manner at both DB interfaces 180 of a DB region 130, may have a same structure at both DB interfaces 180, or the DB contacts 110 at different DB interfaces 180 may have different structures. For example, in some embodiments, a DB contact 110 in one DB interface 180 may include a metal pillar (e.g., a copper pillar), and a complementary DB contact 110 in a complementary DB interface 180 may include a metal pad (e.g., a copper pad) recessed in a dielectric. A DB contact 110 may include any one or more conductive materials, such as copper, manganese, titanium, gold, silver, palladium, nickel, copper and aluminum (e.g., in the form of a copper aluminum alloy), tantalum (e.g., tantalum metal, or tantalum and nitrogen in the form of tantalum nitride), cobalt, cobalt and iron (e.g., in the form of a cobalt iron alloy), or any alloys of any of the foregoing (e.g., copper, manganese, and nickel in the form of manganin). Some particular arrangements of multiple materials in a DB contact 110 are discussed below with reference to FIG. 3). In some embodiments, the DB dielectric 108 and the DB contacts 110 of a DB interface 180 may be manufactured using low-temperature deposition techniques (e.g., techniques in which deposition occurs at temperatures below 250 degrees Celsius, or below 200 degrees Celsius), such as low-temperature plasma-enhanced chemical vapor deposition (PECVD).

FIGS. 1 and 2 also illustrate a microelectronic component 102-2 coupled to the interposer 150 by a DB region 130-2 (via the DB interfaces 180-2A and 180-2B, as shown in FIG. 2). Although FIG. 1 depicts a particular number of microelectronic components 102 coupled to the interposer 150 by DB regions 130, this number and arrangement are simply illustrative, and a microelectronic assembly 100 may include any desired number and arrangement of microelectronic components 102 coupled to an interposer 150 by DB regions 130. Although a single reference numeral "108" is used to refer to the DB dielectrics of multiple different DB interfaces 180 (and different DB regions 130), this is simply for ease of illustration, and the DB dielectric 108 of different DB interfaces 180 (even within a single DB region 130) may have different materials and/or structures (e.g., in accordance with any of the embodiments discussed below with reference to FIG. 3). Similarly, although a single reference numeral "110" is used to refer to the DB contacts of multiple different DB interfaces 180 (and different DB regions 130), this is simply for ease of illustration, and the DB contacts 110 of different DB interfaces 180 (even within a single DB region 130) may have different materials and/or structures (e.g., in accordance with any of the embodiments discussed below with reference to FIG. 4).

The interposer 150 may include an insulating material 106 (e.g., one or more dielectric materials formed in multiple layers, as known in the art) and one or more conductive pathways 112 through the insulating material 106 (e.g., including lines 114 and/or vias 116, as shown). In some embodiments, the insulating material 106 of the interposer 150 may be an organic material, such as polyimide or polybenzoxazole, or may include an organic polymer matrix (e.g., epoxide) with a filler material (that may be inorganic). In some such embodiments, the interposer 150 may be referred to as an "organic interposer." In some embodiments, the insulating material 106 of an interposer 150 may be provided in multiple layers of organic buildup film. Organic interposers 150 may be less expensive to manufacture than semiconductor- or glass-based interposers, and may have electrical performance advantages due to the low dielectric constants of organic insulating materials 106 and the thicker lines that may be used (allowing for improved power delivery, signaling, and potential thermal benefits). Organic interposers 150 may also have larger footprints than can be achieved for semiconductor-based interposers, which are limited by the size of the reticle used for patterning. Further, organic interposers 150 may be subject to less restrictive design rules than those that constrain semiconductor- or glass-based interposers, allowing for the use of design features such as non-Manhattan routing (e.g., not being restricted to using one layer for horizontal interconnects and another layer for vertical interconnects) and the avoidance of through-substrate vias (TSVs) such as through-silicon vias or through-glass vias (which may be limited in the achievable pitch, and may result in less desirable power delivery and signaling performance). Conventional integrated circuit packages including an organic interposer have been limited to solder-based attach technologies, which may have a lower limit on the achievable pitch that precludes the use of conventional solder-based interconnects to achieve the fine pitches desired for next generation devices. Utilizing an organic interposer 150 in a microelectronic assembly 100 with direct bonding, as disclosed herein, may leverage these advantages of organic interposers in combination with the ultra-fine pitch (e.g., the pitch 128 discussed below) achievable by direct bonding (and previously only achievable when using semiconductor-based interposers), and thus may support the design and fabrication of large and sophisticated die complexes that can achieve packaged system competition performance and capabilities not enabled by conventional approaches.

In other embodiments, the insulating material 106 of the interposer 150 may include a fire retardant grade 4 material (FR-4), bismaleimide triazine (BT) resin, or low-k or ultra low-k dielectric (e.g., carbon-doped dielectrics, fluorine-doped dielectrics, and porous dielectrics). When the interposer 150 is formed using standard printed circuit board (PCB) processes, the insulating material 106 may include FR-4, and the conductive pathways 112 in the interposer 150 may be formed by patterned sheets of copper separated by buildup layers of the FR-4. In some such embodiments, the interposer 150 may be referred to as a "package substrate" or a "circuit board."

In some embodiments, one or more of the conductive pathways 112 in the interposer 150 may extend between a conductive contact at the top surface of the interposer 150 (e.g., one of the DB contacts 110) and a conductive contact 118 at the bottom surface of the interposer 150. In some embodiments, one or more of the conductive pathways 112 in the interposer 150 may extend between different conductive contacts at the top surface of the interposer 150 (e.g., between different DB contacts 110 potentially in different DB regions 130, as discussed further below). In some embodiments, one or more of the conductive pathways 112 in the interposer 150 may extend between different conductive contacts 118 at the bottom surface of the interposer 150.

In some embodiments, an interposer 150 may only include conductive pathways 112, and may not contain active or passive circuitry. In other embodiments, an interposer 150 may include active or passive circuitry (e.g., transistors, diodes, resistors, inductors, and capacitors, among others). In some embodiments, an interposer 150 may include one or more device layers including transistors.

Although FIGS. 1 and 2 (and others of the accompanying drawings) illustrate a specific number and arrangement of conductive pathways 112 in the interposer 150, these are simply illustrative, and any suitable number and arrangement may be used. The conductive pathways 112 disclosed herein (e.g., including lines 114 and/or vias 116) may be formed of any appropriate conductive material, such as copper, silver, nickel, gold, aluminum, other metals or alloys, or combinations of materials, for example. Examples of some particular arrangements of liner materials 132 that may be part of conductive pathways 112 are discussed below with reference to FIGS. 9-10.

In some embodiments, a microelectronic component 102 may include an IC die (packaged or unpackaged) or a stack of IC dies (e.g., a high-bandwidth memory dies stack). In some such embodiments, the insulating material of a microelectronic component 102 may include silicon dioxide, silicon nitride, oxynitride, polyimide materials, glass-reinforced epoxy matrix materials, or a low-k or ultra low-k dielectric (e.g., carbon-doped dielectrics, fluorine-doped dielectrics, porous dielectrics, organic polymeric dielectrics, photo-imagable dielectrics, and/or benzocyclobutene-based polymers). In some further embodiments, the insulating material of a microelectronic component 102 may include a semiconductor material, such as silicon, germanium, or a III-V material (e.g., gallium nitride), and one or more additional materials. For example, an insulating material of a microelectronic component 102 may include silicon oxide or silicon nitride. The conductive pathways in a microelectronic component 102 may include conductive lines and/or conductive vias, and may connect any of the conductive contacts in the microelectronic component 102 in any suitable manner (e.g., connecting multiple conductive contacts on a same surface or on different surfaces of the microelectronic component 102). Example structures that may be included in the microelectronic components 102 disclosed herein are discussed below with reference to FIG. 34. In particular, a microelectronic component 102 may include active and/or passive circuitry (e.g., transistors, diodes, resistors, inductors, and capacitors, among others). In some embodiments, a microelectronic component 102 may include one or more device layers including transistors. When a microelectronic component 102 includes active circuitry, power and/or ground signals may be routed through the interposer 150 and to/from a microelectronic component 102 through a DB region 130 (and further through intervening microelectronic components 102). In some embodiments, a microelectronic component 102 may take the form of any of the embodiments of the interposer 150 herein. Although the microelectronic components 102 of the microelectronic assembly 100 of FIG. 1 are single-sided components (in the sense that an individual microelectronic component 102 only has conductive contacts (e.g., DB contacts 110) on a single surface of the individual microelectronic component 102), in some embodiments, a microelectronic component 102 may be a double-sided (or "multi-level," or "omni-directional") component with conductive contacts on multiple surfaces of the component. Some particular examples of double-sided microelectronic components 102 are discussed below with reference to FIG. 28.

Additional components (not shown), such as surface-mount resistors, capacitors, and/or inductors, may be disposed on the top surface or the bottom surface of the interposer 150, or embedded in the interposer 150. The microelectronic assembly 100 of FIG. 1 also includes a support component 182 coupled to the interposer 150. In the particular embodiment of FIG. 1, the support component 182 includes conductive contacts 118 that are electrically coupled to complementary conductive contacts 118 of the interposer 150 by intervening solder 120 (e.g., solder balls in a ball grid array (BGA) arrangement), but any suitable interconnect structures may be used (e.g., pins in a pin grid array arrangement, lands in a land grid array arrangement, pillars, pads and pillars, etc.). The solder 120 utilized in the microelectronic assemblies 100 disclosed herein may include any suitable materials, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, the couplings between the interposer 150 and the support component 182 may be referred to as second-level interconnects (SLI) or multi-level interconnects (MLI).

In some embodiments, the support component 182 may be a package substrate (e.g., may be manufactured using PCB processes, as discussed above). In some embodiments, the support component 182 may be a circuit board (e.g., a motherboard), and may have other components attached to it (not shown). The support component 182 may include conductive pathways and other conductive contacts (not shown) for routing power, ground, and signals through the support component 182, as known in the art. In some embodiments, the support component 182 may include another IC package, an interposer, or any other suitable component. An underfill material 138 may be disposed around the solder 120 coupling the interposer 150 to the support component 182. In some embodiments, the underfill material 138 may include an epoxy material.

In some embodiments, the support component 182 may be a lower density component, while the interposer 150 and/or the microelectronic components 102 may be higher density components. As used herein, the term "lower density" and "higher density" are relative terms indicating that the conductive pathways (e.g., including conductive lines and conductive vias) in a lower density component are larger and/or have a greater pitch than the conductive pathways in a higher density component. In some embodiments, a microelectronic component 102 may be a higher density component, and an interposer 150 may be a lower density component. In some embodiments, a higher density component may be manufactured using a dual damascene or single damascene process (e.g., when the higher density component is a die), while a lower density component may be manufactured using a semi-additive or modified semi-additive process (with small vertical interconnect features formed by advanced laser or lithography processes) (e.g., when the lower density component is a package substrate or an interposer). In some other embodiments, a higher density component may be manufactured using a semi-additive or modified semi-additive process (e.g., when the higher density component is a package substrate or an interposer), while a lower density component may be manufactured using a semi-additive or a subtractive process (using etch chemistry to remove areas of unwanted metal, and with coarse vertical interconnect features formed by a standard laser process) (e.g., when the lower density component is a PCB).

The microelectronic assembly 100 of FIG. 1 may also include a mold material 126. The mold material 126 may extend around one or more of the microelectronic components 102 on the interposer 150. In some embodiments, the mold material 126 may extend between multiple microelectronic components 102 on the interposer 150 and around the DB regions 130. In some embodiments, the mold material 126 may extend above one or more of the microelectronic components 102 on an interposer 150 (not shown). The mold material 126 may be an insulating material, such as an appropriate epoxy material. The mold material 126 may be selected to have a coefficient of thermal expansion (CTE) that may mitigate or minimize the stress between the microelectronic components 102 and the interposer 150 arising from uneven thermal expansion in the microelectronic assembly 100. In some embodiments, the CTE of the mold material 126 may have a value that is intermediate to the CTE of the interposer 150 (e.g., the CTE of the insulating material 106 of the interposer 150) and a CTE of the microelectronic components 102. In some embodiments, the mold material 126 used in a microelectronic assembly 100 may be selected at least in part for its thermal properties. For example, one or more mold materials 126 used in a microelectronic assembly 100 may have low thermal conductivity (e.g., conventional mold compounds) to retard heat transfer, or may have high thermal conductivity (e.g., mold materials including metal or ceramic particles with high thermal conductivity, such as copper, silver, diamond, silicon carbide, aluminum nitride, and boron nitride, among others) to facilitate heat transfer. Any of the mold materials 126 referred to herein may include one or more different materials with different material compositions.

The microelectronic assembly 100 of FIG. 1 may also include a TIM 154. The TIM 154 may include a thermally conductive material (e.g., metal particles) in a polymer or other binder. The TIM 154 may be a thermal interface material paste or a thermally conductive epoxy (which may be a fluid when applied and may harden upon curing, as known in the art). The TIM 154 may provide a path for heat generated by the microelectronic components 102 to readily flow to the heat transfer structure 152, where it may be spread and/or dissipated. Some embodiments of the microelectronic assembly 100 of FIG. 1 may include a sputtered metallization (not shown) across the top surfaces of the mold material 126 and the microelectronic components 102; the TIM 154 (e.g., a solder TIM) may be disposed on this metallization.

The microelectronic assembly 100 of FIG. 1 may also include a heat transfer structure 152. The heat transfer structure 152 may be used to move heat away from one or more of the microelectronic components 102 (e.g., so that the heat may be more readily dissipated). The heat transfer structure 152 may include any suitable thermally conductive material (e.g., metal, appropriate ceramics, etc.), and may include any suitable features (e.g., a heat spreader, a heat sink including fins, a cold plate, etc.). In some embodiments, a heat transfer structure 152 may be or may include an integrated heat spreader (IHS).

The elements of a microelectronic assembly 100 may have any suitable dimensions. Only a subset of the accompanying drawings are labeled with reference numerals representing dimensions, but this is simply for clarity of illustration, and any of the microelectronic assemblies 100 disclosed herein may have components having the dimensions discussed herein. In some embodiments, the thickness 184 of the interposer 150 may be between 20 microns and 200 microns. In some embodiments, the thickness 188 of a DB region 130 may be between 50 nanometers and 5 microns. In some embodiments, a thickness 190 of a microelectronic component 102 may be between 5 microns and 800 microns. In some embodiments, a pitch 128 of the DB contacts 110 in a DB region 130 may be less than 20 microns (e.g., between 0.1 microns and 20 microns).

Figure 3:
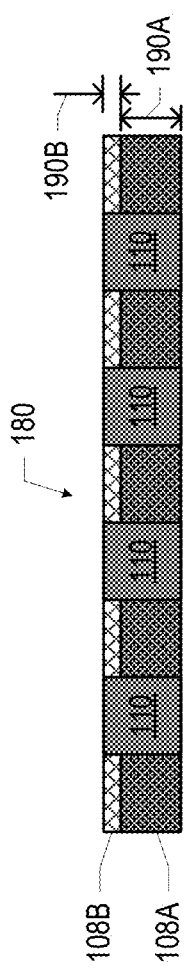
FIGS. 3 and 4 are side, cross-sectional views of example direct bonding interfaces, in accordance with various embodiments.
Figure 4:
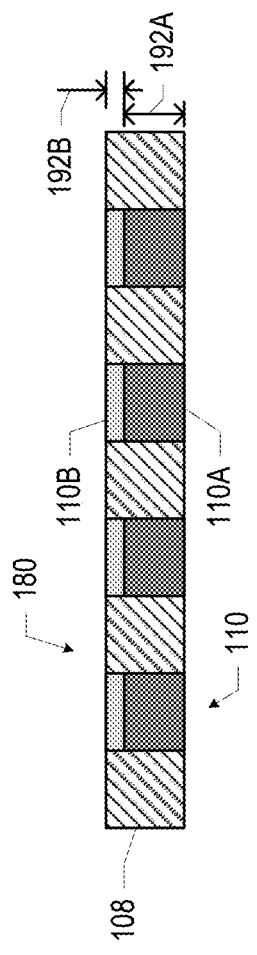
Figure 8:
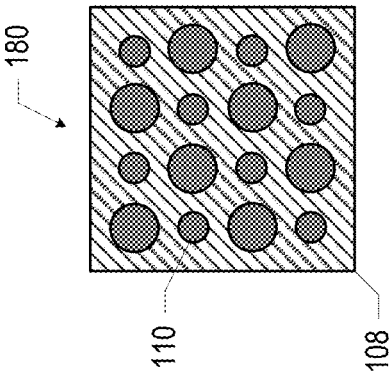
FIGS. 5-8 are top views of example direct bonding interfaces, in accordance with various embodiments.
Figure 9:
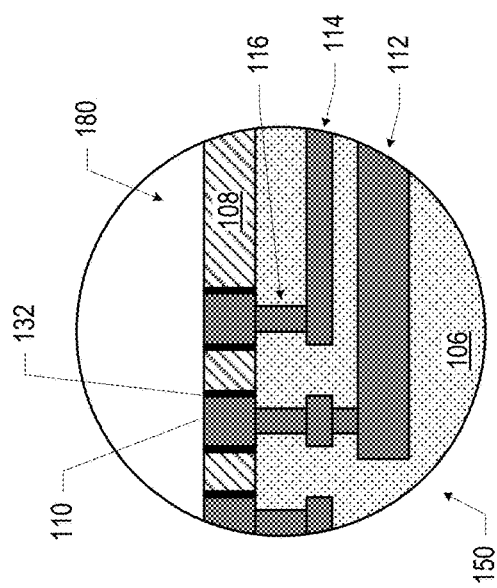
FIGS. 9-12 are side, cross-sectional views of example direct bonding interfaces, in accordance with various embodiments.

FIGS. 3-32 illustrate additional example microelectronic assemblies 100 and components thereof. Any of the features discussed with reference to any of FIGS. 3-32 herein may be combined with any other features to form a microelectronic assembly 100 or component thereof. For example, as discussed further below, FIG. 4 illustrates an embodiment of a DB interface 180 in which a DB contact 110 includes multiple different material portions, and FIG. 9 illustrates an embodiment of a DB interface 180 in which a liner material 132 is present between a DB contact 110 and the adjacent DB dielectric 108. These features of FIGS. 4 and 9 may be combined so that a DB interface 180, in accordance with the present disclosure, has DB contacts 110 with multiple different material portions and a liner material 132 between DB contacts 110 and adjacent DB dielectric 108. This particular combination is simply an example, and any combination may be used.

As noted above, a DB dielectric 108 may include one or more materials arranged in any desired manner. For example, FIG. 3 illustrates a DB interface 180 (which may be part of an interposer 150 or a microelectronic component 102) that includes DB dielectric 108 around DB contacts 110. In the particular embodiment of FIG. 3, the DB dielectric 108 may include a first portion 108A and a second portion 108B, with the second portion 108B between the first portion 108A and the bonding surface of the DB interface 180. The first portion 108A and the second portion 108B may have different material compositions. For example, in some embodiments, the first portion 108A may include silicon and oxygen (e.g., in the form of silicon oxide), and the second portion 108B may include silicon, oxygen, carbon, and nitrogen (e.g., in the form of silicon oxycarbonitride). The thickness 190A of the first portion 108A may be greater than the thickness 190B of the second portion 108B. For example, in some embodiments, the thickness 190B may be less than 5 nanometers (e.g., less than 3 nanometers), while the thickness 190A may be greater than 5 nanometers (e.g., between 50 nanometers and 5 microns). When the thickness 190A is greater than the thickness 190B, the first portion 108A may be referred to as a "bulk" material and the second portion 108B may be referred to as an "interface" material of the DB dielectric 108. Although FIG. 3 illustrates an embodiment in which the DB dielectric 108 includes two portions, a DB dielectric 108 may include more than two portions (e.g., arranged in layers parallel to the bonding surface of the DB interface 180).

As also noted above, a DB contact 110 may include one or more materials arranged in any desired manner. For example, FIG. 4 illustrates a DB interface 180 (which may be part of an interposer 150 or a microelectronic component 102) that includes DB dielectric 108 around DB contacts 110. In the particular embodiment of FIG. 4, the DB contacts 110 may include a first portion 110A and a second portion 110B, with the second portion 110B between the first portion 110A and the bonding surface of the DB interface 180. The first portion 110A and the second portion 110B may have different material compositions. For example, in some embodiments, the first portion 110A may include copper, and the second portion 110B may include a noble metal (e.g., silver or gold); in such embodiments, the second portion 110B may serve to improve the resistance of the DB contacts 110 to corrosion. The thickness 192A of the first portion 110A may be greater than the thickness 192B of the second portion 110B. For example, in some embodiments, the thickness 192B may be less than 5 nanometers, while the thickness 192A may be greater than 50 nanometers. When the thickness 192A is greater than the thickness 192B, the first portion 110A may be referred to as a "bulk" material and the second portion 110B may be referred to as an "interface" material of the DB contacts 110. Although FIG. 4 illustrates an embodiment in which the DB contacts 110 include two portions, a DB contact 110 may include more than two portions (e.g., arranged in layers parallel to the bonding surface of the DB interface 180). In some embodiments, a DB interface 180 may include a DB dielectric 108 with multiple portions and a DB contact 110 with multiple portions.

Figure 7:
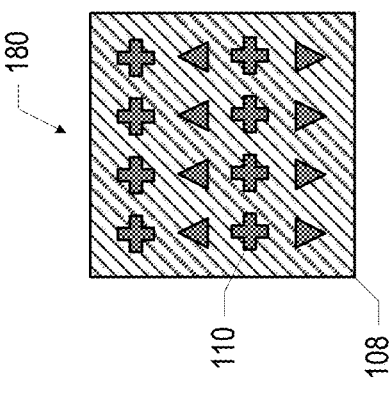
Figure 6:
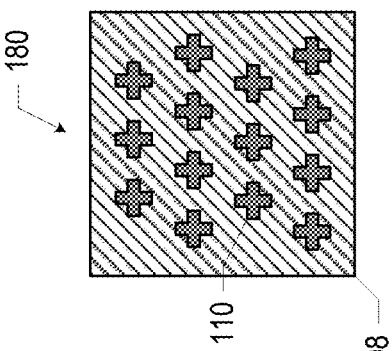
Figure 5:
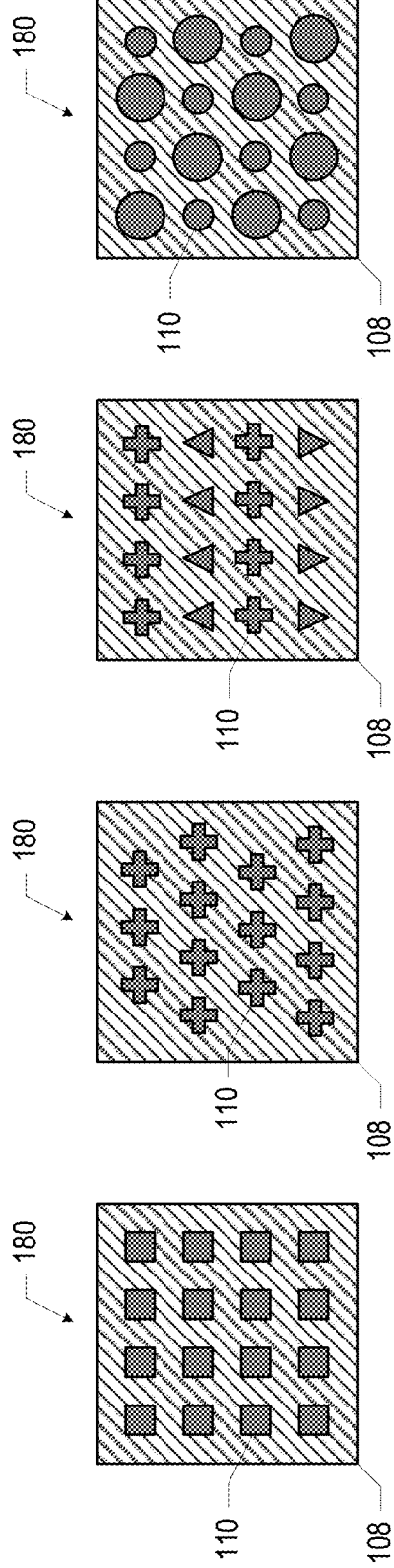

The footprints of the DB contacts 110 in a DB interface 180 may have any desired shape, and multiple DB contacts 110 may be arranged within a DB interface 180 in any desired manner (e.g., by the use of lithographic patterning techniques to form the DB contacts 110). For example, FIGS. 5-8 are top views of various arrangements of DB contacts 110 in a DB dielectric 108 of a DB interface 180. In the embodiment of FIG. 5, the DB contacts 110 have rectangular (e.g., square) footprints and are arranged in a rectangular array. In the embodiment of FIG. 6, the DB contacts 110 have cross-shaped footprints and are arranged in a triangular array. In the embodiment of FIG. 7, the DB contacts 110 are arranged in a rectangular array, and alternating rows of the DB contacts 110 have cross-shaped footprints and triangular footprints. In the embodiment of FIG. 8, the DB contacts 110 are arranged in a rectangular array, the DB contacts 110 have circular footprints, and the diameters of the footprints of the DB contacts 110 vary in a checkerboard pattern. DB contacts 110 included in a DB interface 180 may have any suitable combination of these and other footprint shapes, sizes, and arrangements (e.g., hexagonal arrays, oval footprints, etc.). In some particular embodiments, DB contacts 110 in a DB interface 180 may have footprints shaped as convex polygons (e.g., squares, rectangles, octagons, cross shapes, etc.) or circles.

Figure 10:
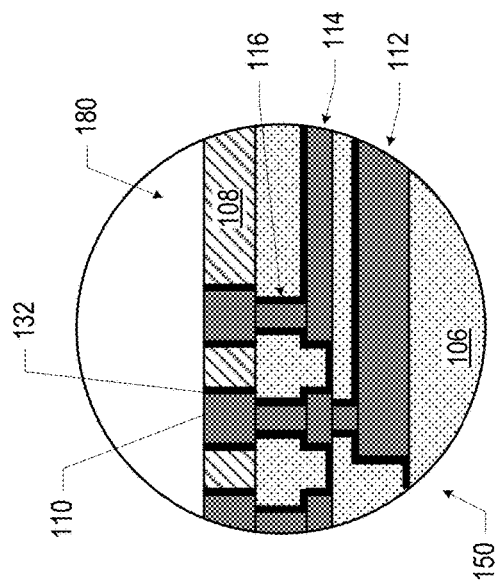

As noted above, in some embodiments, a liner material may be present between a DB contact 110 and the adjacent DB dielectric 108. For example, FIG. 9 illustrates a portion of an interposer 150 and its DB interface 180. In the embodiment of FIG. 9, a liner material 132 is present between the DB contacts 110 and the adjacent DB dielectric 108. The liner material 132 may serve as a diffusion barrier (e.g., to limit diffusion between the DB contacts 110 and the adjacent DB dielectric 108, such as the copper diffusion that may occur when the DB contacts 110 include copper and the DB dielectric 108 includes silicon oxide) and/or as an adhesion promoter (e.g., to improve the strength of the mechanical interface between the DB contacts 110 and the adjacent DB dielectric 108). In the particular embodiment of FIG. 9, the liner material 132 may not be present around the vias 116 and/or the lines 114 through the insulating material 106 of the interposer 150. In other embodiments, the liner material 132 may also be present around the vias 116 and/or the lines 114; such an embodiment is illustrated in FIG. 10. In some embodiments, a liner material 132 may only be present around the vias 116 and/or the lines 114, but not around the DB contacts 110 (not shown). In the embodiment of FIG. 9, the liner material 132 may be a conductive material (e.g., may include cobalt, ruthenium, or tantalum and nitrogen (e.g., in the form of tantalum nitride)), or a non-conductive material (e.g., silicon and nitrogen (e.g., in the form of silicon nitride), or diamond-like carbon). In the embodiment of FIG. 10, the liner material 132 may be a non-conductive material. In still other embodiments, no liner material 132 may be present in an interposer 150. Although various embodiments of the use of liner material 132 are depicted in FIGS. 9 and 10 and discussed with respect to their presence in an interposer 150, this is simply for ease of illustration, and DB interfaces 180 of microelectronic components 102 may also include liner materials 132 (e.g., only around the DB contacts 110, and/or around lines and vias in a metallization stack of the microelectronic component 102).

Figure 11:
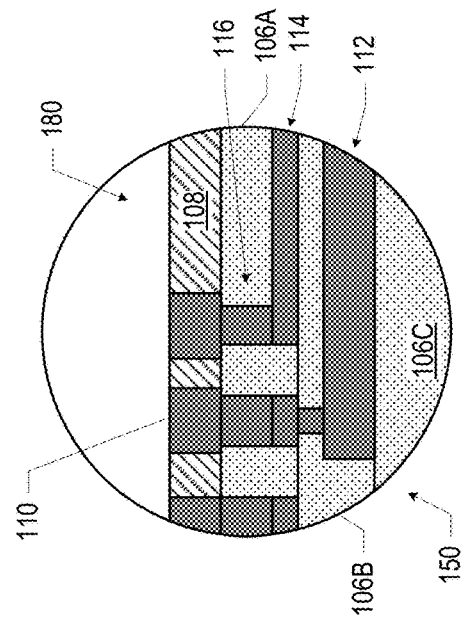

In some embodiments, lithographic via techniques may be used to form one or more layers of metallization in an interposer 150 (e.g., in an organic interposer 150) or a microelectronic component 102. For example, FIG. 11 illustrates a portion of an interposer 150 and its DB interface 180. In the embodiment of FIG. 11, three different layers of insulating material 106 are shown (labeled as 106A, 106B, and 106C). Within the "top" layer 106A (the layer closest to the DB interface 180), vias 116 may be patterned using lithographic techniques (e.g., "zero-misalignment" techniques) so that their side faces are aligned with side faces of the lines 114 on which they land. In "lower" layers (e.g., the layer 106B), vias 116 may be patterned using conventional techniques and the side faces of the vias 116 may not align with side faces of the lines 114 on which they land. More generally, a via 116 formed lithographically may have any desired footprint (e.g., a non-circular footprint). In the embodiment of FIG. 11, the DB contacts 110 may be "pads" in conductive contact with the vias 116 of the layer 106A. The use of lithographic via techniques in the formation of the DB interface 180 may result in an extremely flat DB interface 180 due to the planarization (e.g., chemical mechanical polishing) operations performed during lithographic via fabrication, and flat DB interfaces 180 may more reliably form direct bonds than more "uneven" DB interfaces 180. Thus, the use of lithographic via techniques to form the DB contacts 110 of a DB interface 180 may support a mechanically and electrically reliable DB region 130.

Figure 12:
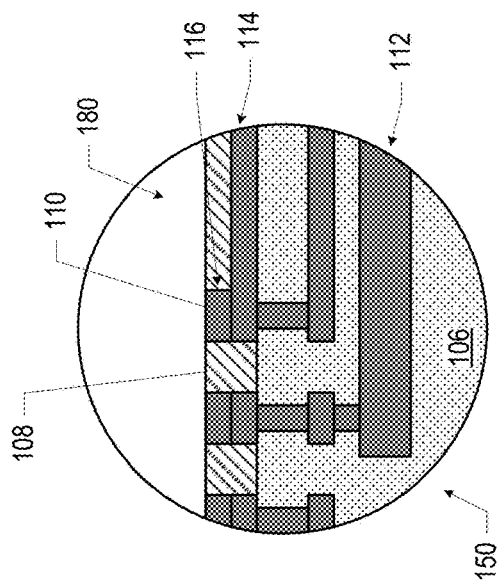

In some embodiments, lithographic via techniques may be used to form the DB contacts 110 in a DB interface 180 of an interposer 150 (e.g., in an organic interposer 150) or a microelectronic component 102. For example, FIG. 12 illustrates a portion of an interposer 150 and its DB interface 180. In the embodiment of FIG. 12, a DB contact 110 includes a via 116 and a line 114 on which the via 116 lands; these vias 116 may be patterned using lithographic techniques (e.g., so that the side faces of the vias 116 are aligned with side faces of the lines 114 on which they land). The DB dielectric 108 may contact the vias 116 and lines 114 of the DB contacts 110, as shown. Metallization in the insulating material 106 may be patterned using lithographic techniques or conventional techniques. Although various embodiments of vias 116/lines 114 are depicted in FIGS. 11 and 12 and discussed with respect to their presence in an interposer 150, this is simply for ease of illustration, and DB interfaces 180 of microelectronic components 102 may also include lithographically patterned vias 116/lines 114 in the DB interfaces 180 and/or the other metallization.

Figure 13:
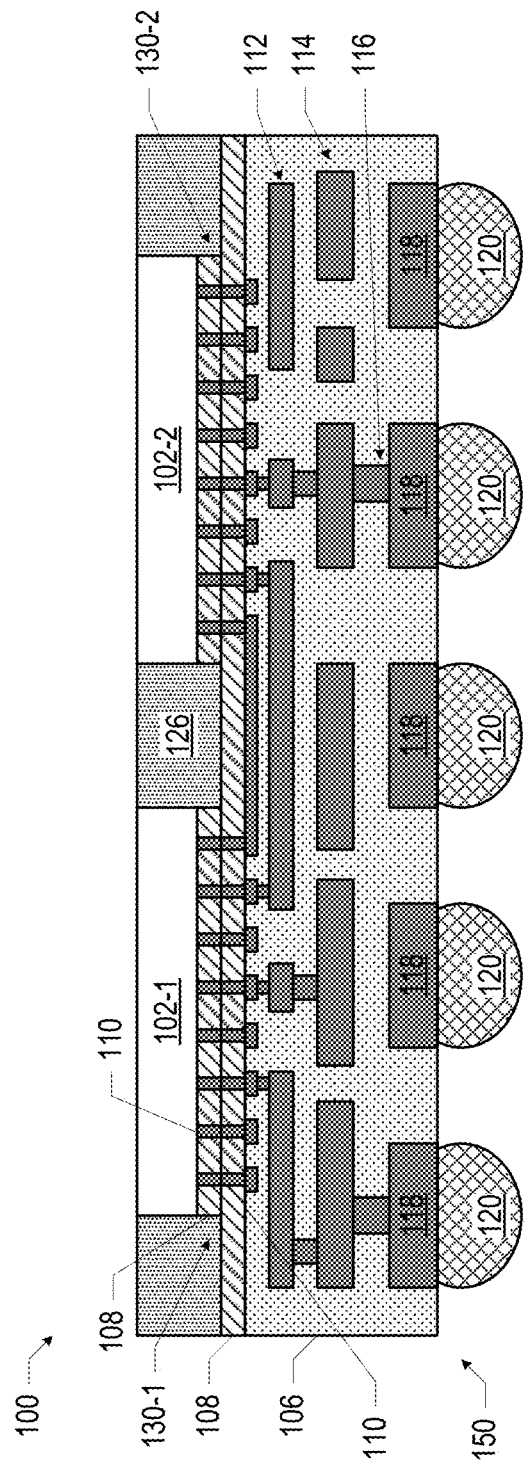
FIG. 13 is a side, cross-sectional view of an example microelectronic assembly including direct bonding, in accordance with various embodiments.

In the embodiment of FIGS. 1 and 2, the DB contacts 110 are shown as pads in contact with vias 116 in the underlying insulating material 106. In other embodiments, the DB contacts 110 may be vias themselves. For example, FIG. 13 illustrates an embodiment in which the DB contacts 110 are vias in contact with pads in the insulating material 106; as shown, the DB contacts 110 may be narrower than the pads with which they are in contact.

The microelectronic assembly 100 of FIGS. 1 and 2, and others of the microelectronic assemblies 100 disclosed herein, may be manufactured in any suitable manner. For example, FIGS. 14-17 are side, cross-sectional views of example stages in the manufacture of a portion of the microelectronic assembly 100 of FIGS. 1 and 2, in accordance with various embodiments. Although the operations discussed with reference to FIGS. 14-17 may be illustrated with reference to particular embodiments of the microelectronic assemblies 100 disclosed herein, the manufacturing methods discussed with reference to FIGS. 14-17 may be used to form any suitable microelectronic assemblies 100. Operations are illustrated once each and in a particular order in FIGS. 14-17, but the operations may be reordered and/or repeated as desired (e.g., with different operations performed in parallel when manufacturing multiple microelectronic assemblies 100 simultaneously). The manufacturing processes discussed below with reference to FIGS. 14-17 may be particularly advantageous when the interposer 150 is an organic interposer, and may also be advantageous for glass-based or semiconductor-based interposers (e.g., glass-based or silicon-based interposers in which the underlying glass or silicon wafer has already been thinned, and TSVs formed, before any direct bonding operations). However, any suitable manufacturing processes may be used to manufacture any of the microelectronic assemblies 100 disclosed herein.

Figure 14:
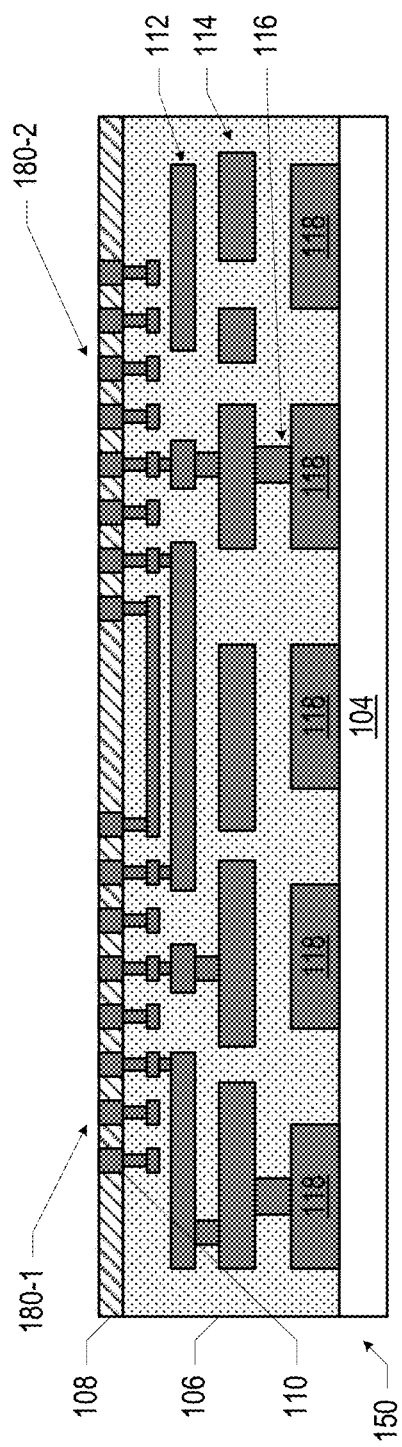
FIGS. 14-17 are side, cross-sectional views of example stages in the manufacture of a portion of the microelectronic assembly of FIGS. 1 and 2, in accordance with various embodiments.

FIG. 14 illustrates an assembly including an interposer 150 mounted on a carrier 104. The interposer 150 includes two exposed DB interfaces 180-1 and 180-2. The carrier 104 may include any suitable material, and in some embodiments, may include a semiconductor wafer (e.g., a silicon wafer) or glass (e.g., a glass panel). When the interposer 150 is an organic interposer, the interposer 150 may be advantageously manufactured on the carrier 104, which may provide a mechanically stable surface on which the layers of the interposer 150 may be formed.

Figure 15:
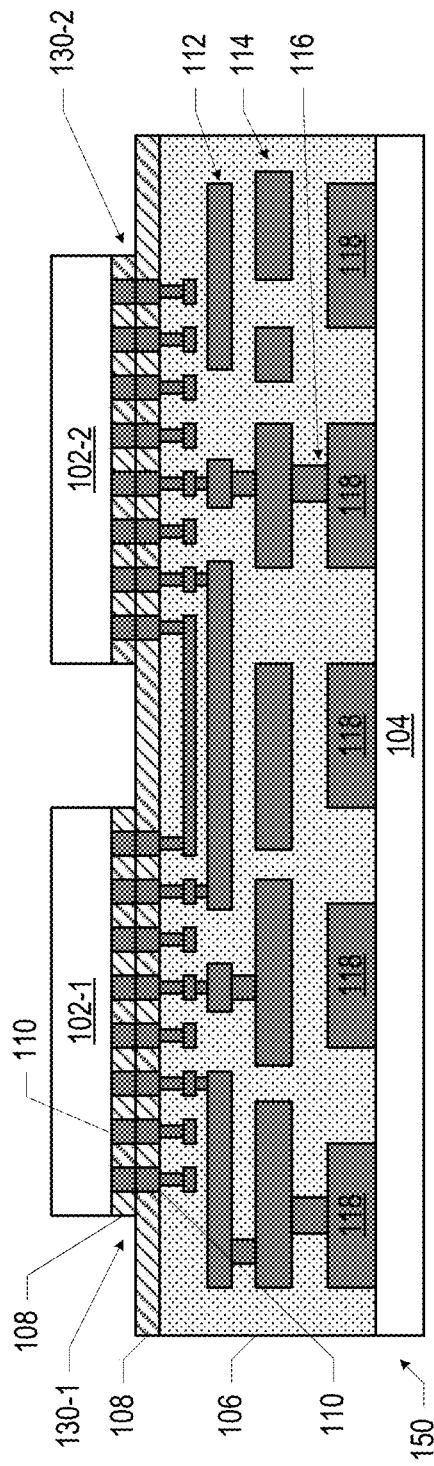

FIG. 15 illustrates an assembly subsequent to direct bonding microelectronic components 102-1 and 102-2 to the interposer 150/carrier 104 of FIG. 14. In particular, DB interfaces 180 (not labeled) of the microelectronic components 102 may be brought into contact with the DB interfaces 180 of the interposer 150, and heat and/or pressure may be applied to bond the contacting DB interfaces 180 to form DB regions 130 (with DB regions 130-1 and 130-2 corresponding to the DB interfaces 180-1 and 180-2, respectively).

Figure 16:
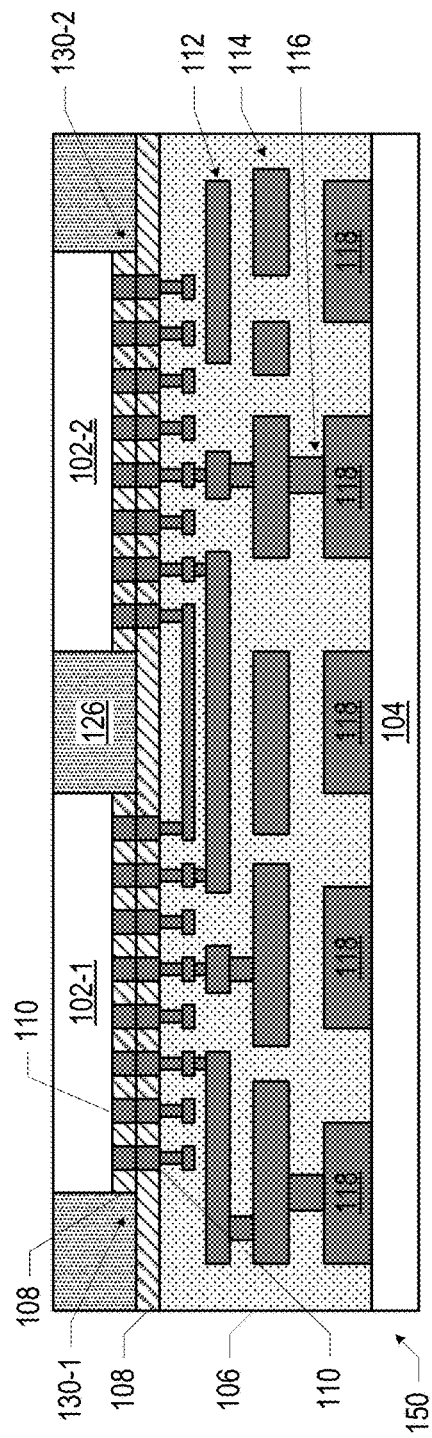

FIG. 16 illustrates an assembly subsequent to providing a mold material 126 around the microelectronic components 102 and on the surface of the interposer 150 of the assembly of FIG. 15. In some embodiments, the mold material 126 may extend above and remain above the microelectronic components 102, while in other embodiments, the mold material 126 may be polished back to expose the top surfaces of the microelectronic components 102, as shown.

Figure 17:
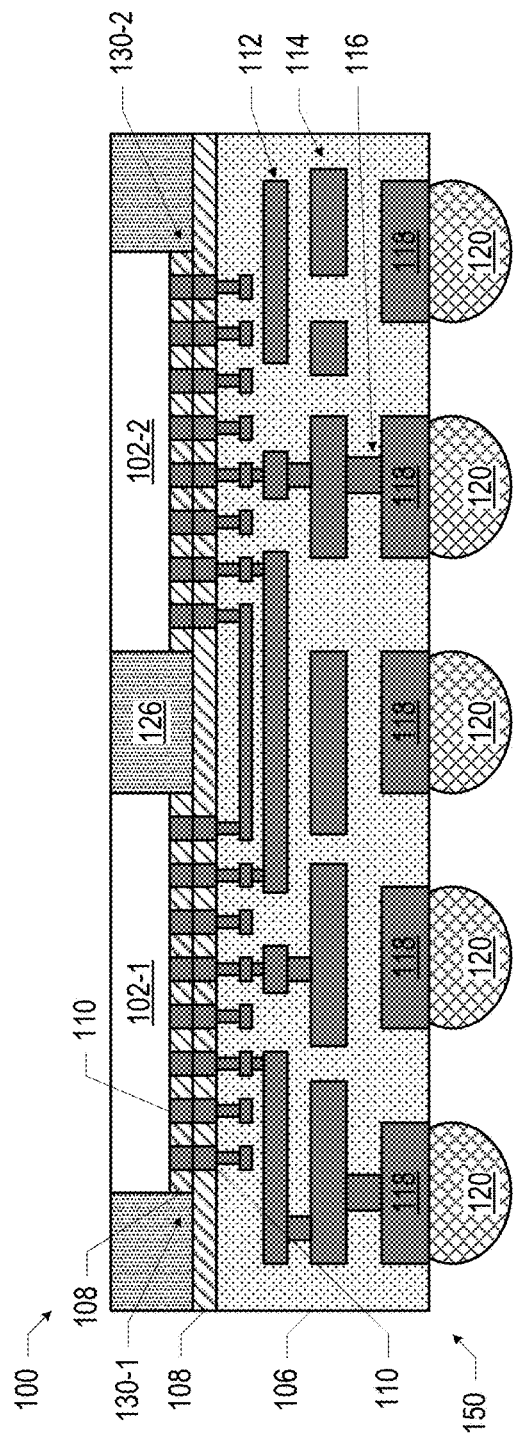

FIG. 17 illustrates an assembly subsequent to removing the carrier 104 from the assembly of FIG. 16, and providing solder 120 on the newly exposed conductive contacts 118. The assembly of FIG. 17 may itself be a microelectronic assembly 100, as shown. Further manufacturing operations may be performed on the microelectronic assembly 100 of FIG. 17 to form other microelectronic assemblies 100; for example, the solder 120 may be used to couple the microelectronic assembly 100 of FIG. 17 to a support component 182, and a TIM 154 and heat transfer structure 152 may be provided on the top surface of the microelectronic assembly 100 of FIG. 17, forming the microelectronic assembly 100 of FIGS. 1 and 2.

Figure 18:
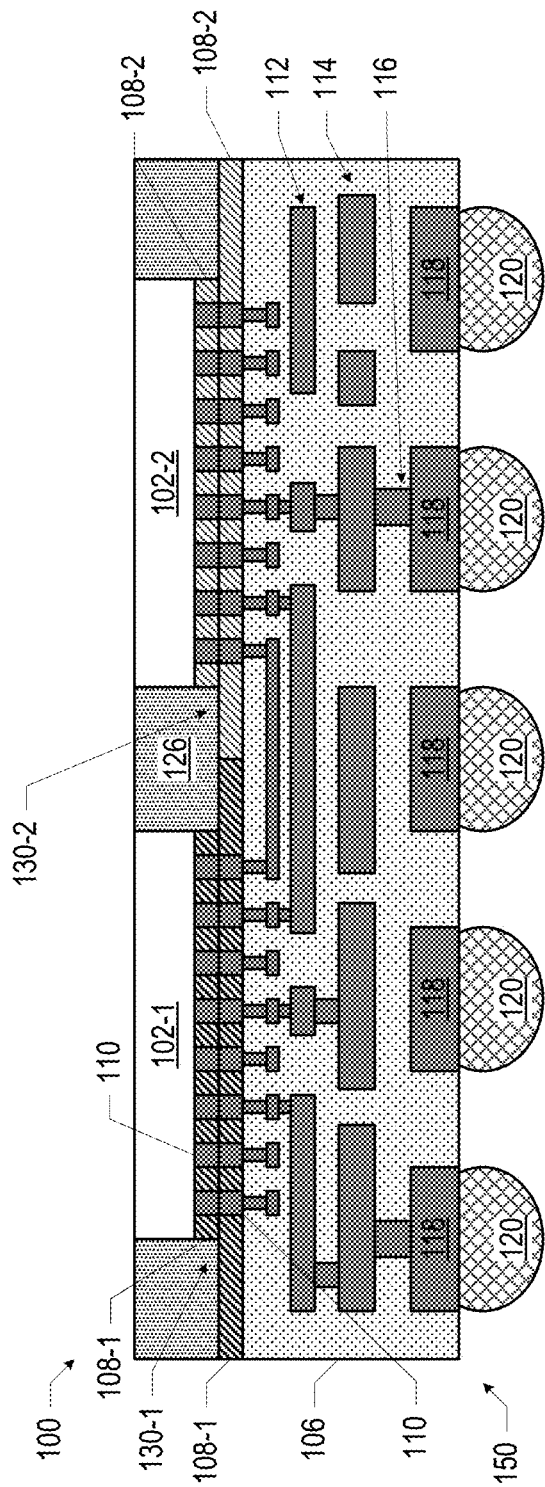

Different DB regions 130 in a microelectronic assembly 100 may include different DB dielectrics 108. For example, FIG. 18 illustrates a microelectronic assembly 100 in which a DB region 130-1 includes a DB dielectric 108-1 and a DB region 130-2 includes a different DB dielectric 108-2. The DB dielectrics 108-1 and 108-2 may differ in their material composition and/or their structure. In some embodiments, DB dielectrics 108 in different DB regions 130 may be selected to have different thermal conductivities so as to facilitate and/or limit heat transfer between the interposer 150 and the microelectronic components 102. For example, the DB dielectric 108-1 may have a higher thermal conductivity than the DB dielectric 108-2, resulting in greater heat transfer between the microelectronic component 102-1 and the interposer 150 than between the microelectronic component 102-2 and the interposer 150. In some such embodiments, the DB dielectric 108-1 may include silicon and nitrogen (e.g., in the form of silicon nitride) and the DB dielectric 108-2 may include silicon and oxygen (e.g., in the form of silicon oxide); silicon nitride may have a higher thermal conductivity than silicon oxide, and thus the use of silicon nitride as the DB dielectric 108-1 may enhance local heat transfer from the microelectronic component 102-1 to the interposer 150, while the use of silicon oxide as the DB dielectric 108-2 may mitigate thermal cross-talk through the interposer 150 between the microelectronic component 102-1 and the microelectronic component 102-2.

Figure 19:
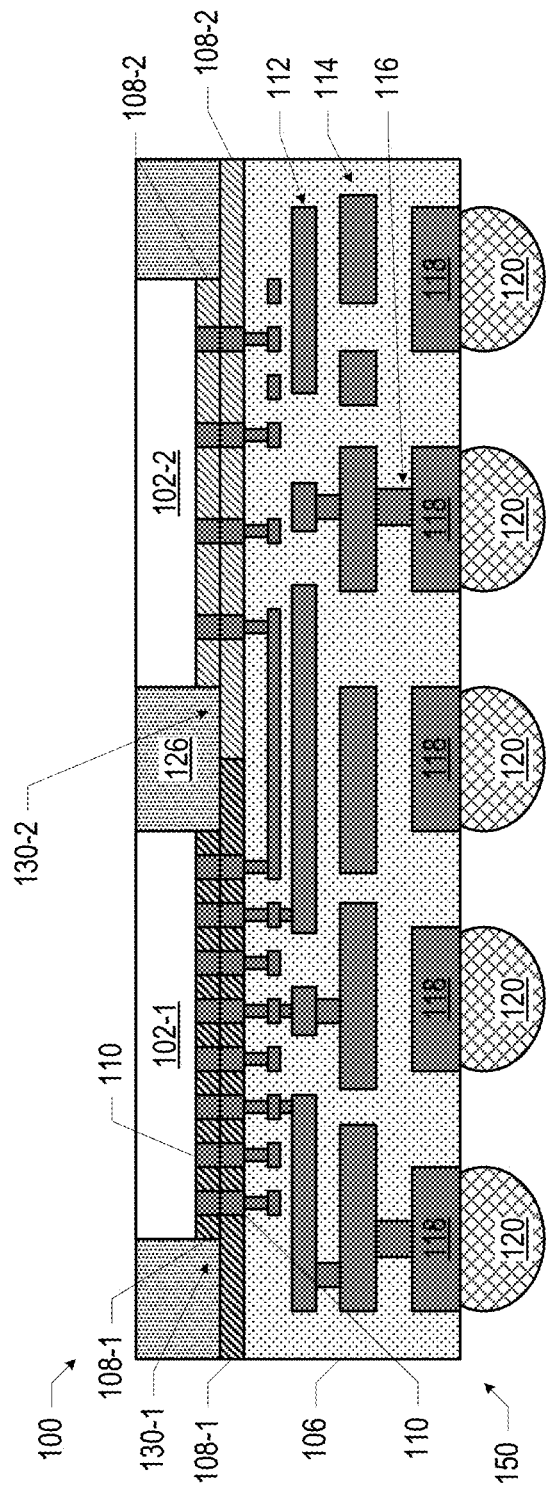

In some embodiments, the density of the DB contacts 110 (i.e., the proportion of the area of a bonding surface of a DB interface 180 occupied by DB contacts 110) may differ between different DB regions 130. In some embodiments, this different density may be due to one DB region 130 requiring fewer electrical pathways than another DB region 130. In other embodiments, this differing density may be used to enhance or suppress heat transfer, with greater density of DB contacts 110 (and therefore a higher proportion of thermally conductive metal) being used to enhance heat transfer and lesser density of DB contacts 110 (and therefore a lower portion of thermally conductive metal) being used to suppress heat transfer. For example, FIG. 19 illustrates an embodiment in which the density of DB contacts 110 is greater in the DB region 130-1 than in the DB region 130-2 to enhance heat transfer between the microelectronic component 102-1 and the interposer 150 and to reduce heat transfer between the microelectronic component 102-2 and the interposer 150. FIG. 19 illustrates different densities of DB contacts 110 being accompanied by the use of different DB dielectrics 108 in different DB regions 130, but in some embodiments, two DB regions 130 may have different densities of DB contacts 110 while having DB dielectrics 108 with the same material composition.

FIG. 20 illustrates another embodiment of a microelectronic assembly 100 in which, like the embodiment of FIG. 19, the density of DB contacts 110 is greater in the DB region 130-1 than in the DB region 130-2 to enhance heat transfer between the microelectronic component 102-1 and the interposer 150 and to reduce heat transfer between the microelectronic component 102-2 and the interposer 150. In the embodiment of FIG. 19, the size (e.g., the area of the footprint) of the DB contacts 110 of the DB region 130-1 may be the same as the size of the DB contacts 110 of the DB region 130-2; the DB region 130-1 may simply include more DB contacts 110 than the DB region 130-2. In the embodiment of FIG. 20, the size (e.g., the area of the footprint) of the DB contacts 110 of the DB region 130-1 may be greater than the size of the DB contacts 110 of the DB region 130-2; the number of DB contacts 110 of the DB region 130-1 may be the same as, greater than, or less than the number of DB contacts 110 of the DB region 130-2. For example, FIG. 21 is a top view of a DB interface 180 that may correspond to the DB region 130-1 of the microelectronic assembly 100 of FIG. 20, and FIG. 22 is a top view of a DB interface 180 that may correspond to the DB region 130-2 of the microelectronic assembly 100 of FIG. 20. In the embodiment of FIG. 21, the DB contacts 110 may have large rectangular footprints and may be closely spaced relative to the DB contacts 110 of FIG. 22, which may have smaller circular footprints and may be sparsely distributed. Any other suitable combination of size, shape, and distribution of DB contacts 110 may be used in different DB regions 130 of a microelectronic assembly 100 (e.g., to achieve desired thermal properties, or for other purposes); such configurability may not be achievable using other attach technologies, such as solder attach, which conventionally require significant uniformity and regularity in contact location and size in order to achieve reliable attachment.

In some embodiments, a single DB region 130 may have multiple subregions with different metal density; such embodiments may be advantageous for achieving desired thermal transfer between different portions of a microelectronic component 102 and an interposer 150 or microelectronic component 102. For example, some portions of a microelectronic component 102 may generate more heat than other regions (e.g., a central processing unit (CPU) may have high power areas, such as matrix multipliers and cache areas, and other lower power areas), and thus within a DB region 130, subregions proximate to those portions may have greater metal density (e.g., achieved by any suitable combination of size, shape, and distribution of DB contacts 110) than subregions of the DB region 130 that are not proximate to those portions. In another example, some portions of a microelectronic component 102 may be more sensitive to increases in temperature (e.g., increases in temperature may cause significant negative performance consequences), and thus within a DB region 130, subregions proximate to those portions may have lesser metal density (e.g., achieved by any suitable combination of size, shape, and distribution of DB contacts 110) than subregions of the DB region 130 that are not proximate to those portions. FIG. 23 illustrates a microelectronic assembly 100 in which a DB region 130-1 includes a first subregion 130-1A and a second subregion 130-1B, and the metal density of the first subregion 130-1A is greater than the metal density of the second subregion 130-1B. The microelectronic assembly 100 of FIG. 23 also illustrates a DB region 130-2 that includes a first subregion 130-2A and a second subregion 130-2B, with the metal density of the first subregion 130-2A greater than the metal density of the second subregion 130-2B. FIG. 24 is a top view of a DB interface 180-1 that may correspond to the DB region 130-1 of the microelectronic assembly 100 of FIG. 23, and FIG. 24 is a top view of a DB interface 180-2 that may correspond to the DB region 130-2 of the microelectronic assembly 100 of FIG. 23. In particular, in FIG. 24, a first subregion 180-1A of the DB interface 180-1 may correspond to the first subregion 130-1A of the DB region 130-1 of FIG. 23, and a second subregion 180-1B of the DB interface 180-1 may correspond to the second subregion 130-1B of the DB region 130-1 of FIG. 23; similarly, in FIG. 25, a first subregion 180-2A of the DB interface 180-2 may correspond to the first subregion 130-2A of the DB region 130-2 of FIG. 23, and a second subregion 180-2B of the DB interface 180-2 may correspond to the second subregion 130-2B of the DB region 130-2 of FIG. 23. In the embodiment of FIG. 24, the second subregion 180-1B may partially wrap around the first subregion 180-1A, and in the embodiment of FIG. 25, the second subregion 180-2B may wrap around the first subregion 180-2A; these particular arrangements are simply illustrative, and a DB region 130/DB interface 180 may include any desired arrangement of subregions with different metal densities. Further, although the embodiments of FIGS. 23-25 depict DB regions 130/DB interfaces 180 that include 2 subregions, this is simply illustrative, and a DB region 130/DB interface 180 may include two or more subregions, as desired.

Figure 26A:
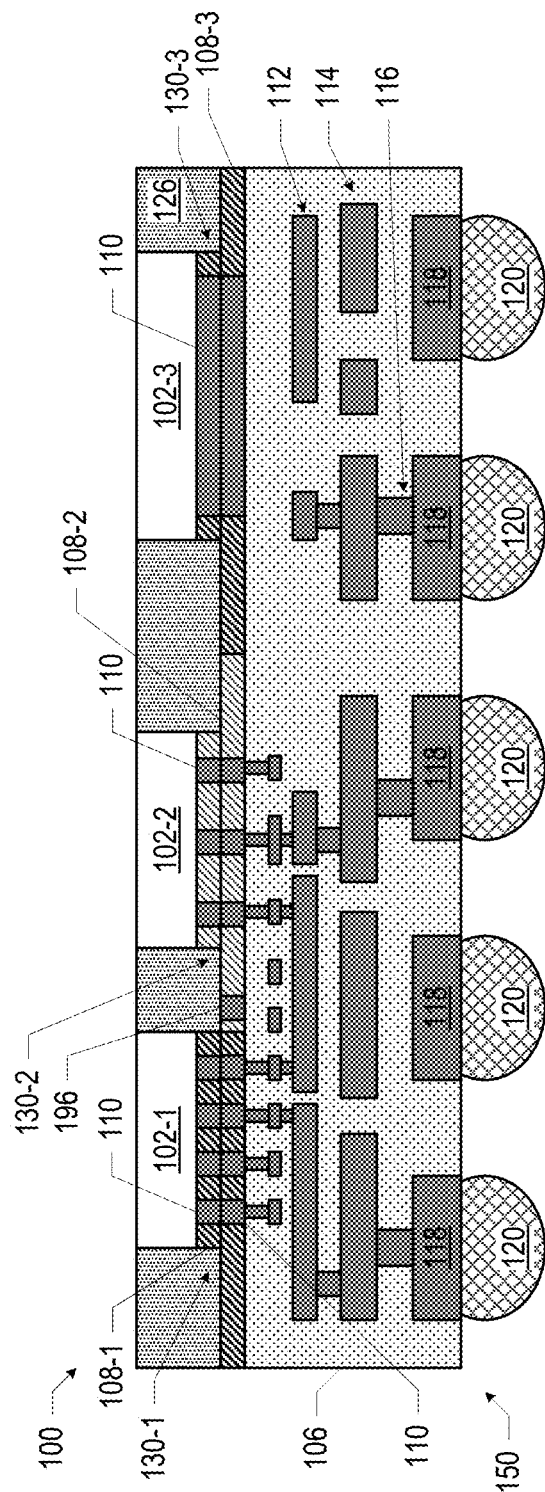
FIGS. 26A-26B are side, cross-sectional and top views, respectively, of a microelectronic assembly including dummy metal traces in and around the direct bonding regions, in accordance with various embodiments.
Figure 26B:
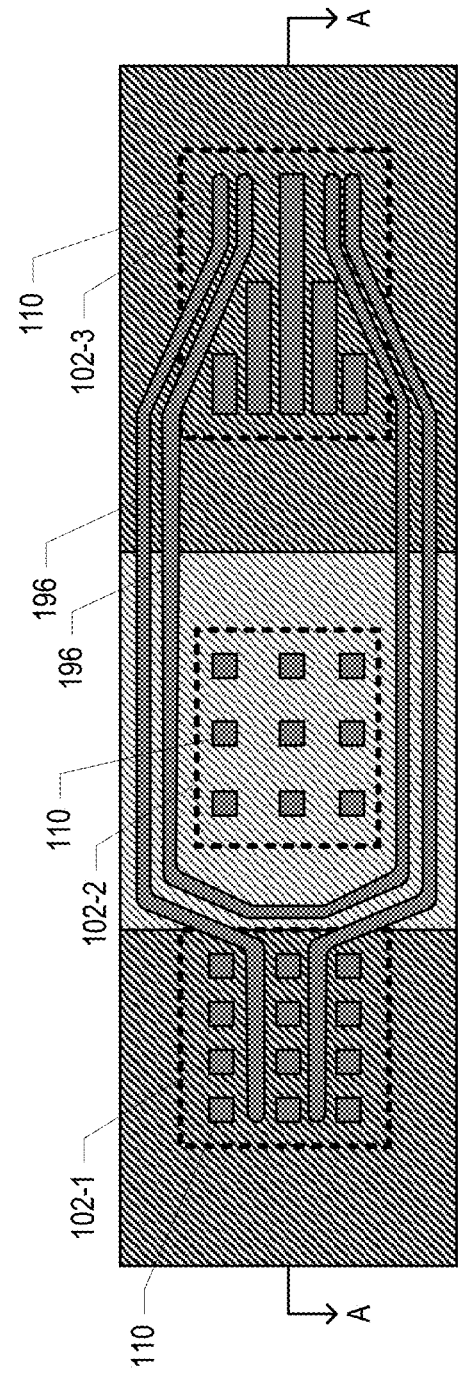

In some embodiments, a microelectronic assembly 100 may include features in one or more DB interfaces 180 that may exhibit anisotropic in-plane thermal conductivity, and thus may selectively transfer heat around a surface. For example, FIG. 26 depicts a microelectronic assembly 100 in which dummy metal traces 196 (including, e.g., copper and/or any of the materials discussed herein with reference to the DB contacts 110) are coplanar with the DB contacts 110, and may extend from one DB region 130 to another DB region 130 (i.e., between the DB regions 130-1 and 130-3 of FIG. 26). FIG. 26A is a side, cross-sectional view (through the section A-A of FIG. 26B) of such a microelectronic assembly 100, and FIG. 26B is a top view of the microelectronic assembly 100 with the mold material 126 and the microelectronic components 102 removed so that the DB contacts 110 and the dummy metal traces 196 are visible; the dashed boxes in FIG. 26B indicate the footprints of the microelectronic components 102-1, 102-2 and 102-3. The dummy metal traces 196 may not be coupled to any circuitry in the microelectronic components 102 or in the interposer 150, but may instead be present as thermal conduits, allowing heat to move along the dummy metal traces 196 in accordance with their pattern; in other embodiments, the dummy metal traces 196 may be coupled to dummy metal lines/vias (e.g., for additional thermal transfer) in the microelectronic components 102 and/or the interposer 150.

In the embodiment of FIG. 26, one or more dummy metal traces 196 may extend between the DB region 130-1 (e.g., "under" the microelectronic component 102-1) and the DB region 130-3 (e.g., "under" the microelectronic component 102-3). One or more dummy metal traces 196 may not extend under multiple microelectronic components 102, but may extend near to multiple microelectronic components 102 and/or under a single microelectronic component 102; an example of such a dummy metal trace 196 is shown in FIG. 26B, extending proximate to the footprint of the microelectronic component 102-1, and under the microelectronic component 102-3. In some such embodiments, the microelectronic component 102-1 may be a heat-generating component and the microelectronic component 102-3 may be a dummy component (e.g., without active devices, and present to act at least in part as a heat sink); during operation, heat generated by the microelectronic component 102-1 may be absorbed by the dummy metal traces 196 and transferred to the microelectronic component 102-3, cooling the microelectronic component 102-1. In some embodiments, dummy metal traces 196 may extend around a footprint of a microelectronic component 102 that is thermally sensitive (e.g., a memory component, an amplifier, etc.). For example, in the embodiment of FIG. 26, the dummy metal traces 196 extend around the footprint of the microelectronic component 102-2. In some embodiments, the DB dielectric 108-2 of the DB region 130-2 (associated with the microelectronic component 102-2) may be selected to have a lower thermal conductivity than the thermal conductivities of the DB dielectric 108-1 of the DB region 130-1 and the DB dielectric 108-3 of the DB region 130-3 in order to further thermally insulate the microelectronic component 102-2 from heat generated and/or carried by the microelectronic components 102-1 and 102-3 and the dummy metal traces 196. The dummy metal traces 196 may be part of one or more DB regions 130 (e.g., in the areas in which the dummy metal traces 196 overlap the footprints of the microelectronic components 102), and thus some or all of the dummy metal traces 196 may be used for direct bonding.

Figure 27:
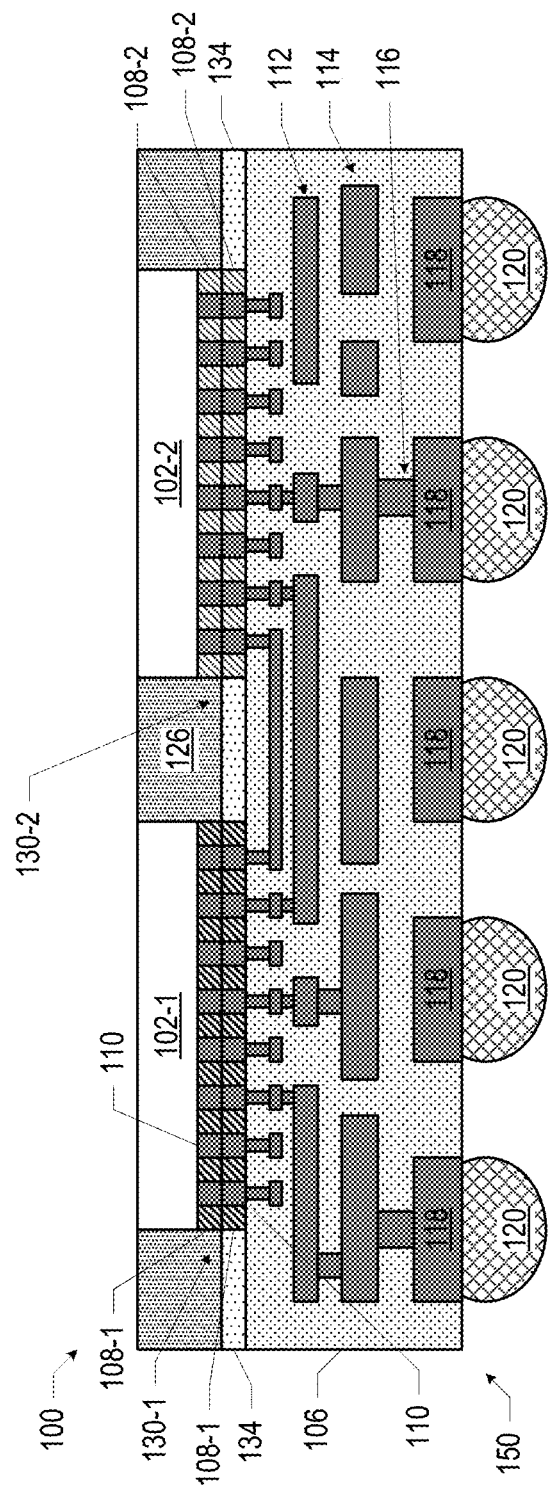
FIGS. 27-28 are side, cross-sectional views of example microelectronic assemblies including direct bonding, in accordance with various embodiments.

In the embodiment of FIGS. 1 and 2, the DB dielectric 108 extends outside of the DB regions 130, covering the remainder of the top surface of the interposer 150. In other embodiments, a different material may be disposed at the top surface of the interposer 150 outside of the DB regions 130. For example, FIG. 27 illustrates a microelectronic assembly 100 in which a material 134, different from the DB dielectrics 108-1 and 108-2, is disposed at the top surface of the interposer 150 (e.g., in contact with the mold material 126).

In some embodiments, the material 134 may include one or more dielectric materials, such as one or more organic or inorganic dielectric materials. For example, the material 134 may include an inorganic dielectric material that includes silicon and nitrogen (e.g., in the form of silicon nitride); silicon and oxygen (e.g., in the form of silicon oxide); or silicon, carbon, and nitrogen (e.g., in the form of silicon carbonitride); or the material 134 may include an organic dielectric material, such as a particle-filled epoxide, a polyimide, a particle-filled polyimide, or poly(p-phenylene-2,6-benzobisoxazole)) (PBO). In some embodiments, the material 134 may be a dielectric material, and an additional conductive material (e.g., a metal such as aluminum or copper) may be disposed on the material 134.

Figure 28:
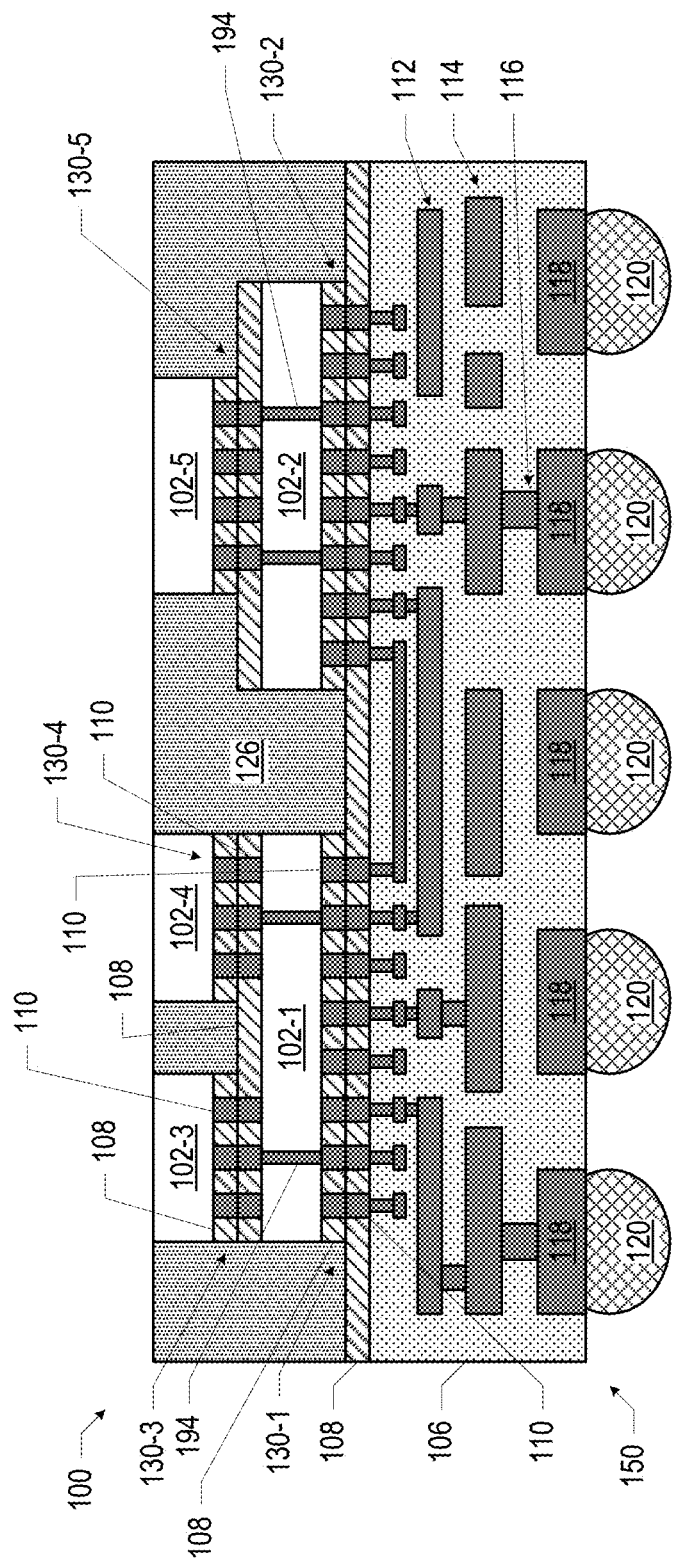

A microelectronic assembly 100 may include multiple "tiers" of microelectronic components 102 coupled by direct bonding. For example, FIG. 28 illustrates a microelectronic assembly 100 in which the microelectronic component 102-1 includes two DB interfaces 180 (not labeled) at its top surface, and microelectronic components 102-3 and 102-4 with their own DB interfaces 180 (not labeled) at the bottom surfaces are coupled to the microelectronic component 102-1 via DB regions 130-3 and 130-4, respectively. Similarly, the microelectronic component 102-2 includes a DB interface 180 (not labeled) at its top surface, and a microelectronic component 102-5 with its own DB interface 180 (not labeled) at its bottom surface is coupled to the microelectronic component 102-2 via a DB region 130-5. The microelectronic assembly 100 of FIG. 28 may thus be described as having two tiers of direct bonded microelectronic components 102. Any microelectronic component 102 disclosed herein may include one or more dies and may have different types of pass-through conductive interconnects, such as copper pillars and TSVs (e.g., through-silicon vias).

In some embodiments, the microelectronic components 102-1 and 102-2 in the first tier of the microelectronic assembly 100 of FIG. 28 may include conductive structures 194 that extend between the DB regions 130 at their top and bottom surfaces, providing conductive pathways for power, ground, and/or signals to the microelectronic components 102 in the second tier (i.e., the microelectronic components 102-3, 102-4, and 102-5). In some embodiments, such a conductive structure 194 may include one or more TSVs, including a conductive material via, such as a metal via, isolated from the surrounding silicon or other semiconductor material by a barrier oxide), such as through-silicon vias when the microelectronic components 102-1 and 102-2 include silicon substrates or through-glass vias when the microelectronic components 102-1 and 102-2 include glass substrates. In some embodiments, the microelectronic components 102-1 and 102-2 in a first tier may be passive (e.g., including no transistors) or active (e.g., including transistors in the form of memory circuitry and/or power delivery circuitry).

In the embodiment of FIG. 28, a mold material 126 may extend up to and may laterally surround the microelectronic components 102 in the second tier, and in some embodiments (not shown), the mold material 126 may cover the top surfaces of the microelectronic components 102 in the second tier. In other embodiments, the top surface of the mold material 126 may be coplanar with the exposed DB interfaces 180, or recessed below the exposed DB interfaces 180. In some embodiments, a microelectronic assembly 100 including exposed DB interfaces 180 may have a temporary, removable protective material (e.g., an adhesive material, not shown) on the exposed DB interfaces 180 to protect them until direct bonding operations are performed. Microelectronic assemblies 100 including multiple tiers of microelectronic components 102 may be formed in a manner discussed above with reference to FIGS. 14-17, with the additional tiers of microelectronic components 102 coupled to the preceding assemblies prior to deposition of the mold material 126. In some other embodiments, a microelectronic assembly 100 including multiple tiers of microelectronic components 102 may be formed by first assembling the tiers of microelectronic components 102, and then coupling the assembled tiers to an interposer 150 as discussed above with reference to FIG. 15. A microelectronic assembly 100 may not be limited to two tiers of microelectronic components 102, but may include three or more tiers, as desired. Further, although the microelectronic components 102 in an individual tier in FIG. 28 are depicted as having a same height, this is simply for ease of illustration, and microelectronic components 102 in any individual tier in a microelectronic assembly 100 may have different heights. Further, not every microelectronic component 102 in a microelectronic assembly 100 may be part of a stack of multiple microelectronic components 102; for example, in some variants of the microelectronic assembly 100 of FIG. 28, no microelectronic component 102-5 may be present on top of the microelectronic component 102-2 (and thus the microelectronic component 102-2 may not include conductive structures 194 (e.g., may not include TSVs)).

In some embodiments, a microelectronic assembly 100 may include one or more DB interfaces 180 exposed at a surface of the microelectronic assembly 100. Although various ones of the preceding drawings illustrate DB regions 130 at a single surface of the interposer 150 (e.g., the top surface), a microelectronic assembly 100 may include DB regions 130 at multiple surfaces of an interposer 150. In some embodiments, a microelectronic component 102 coupled by direct bonding to a bottom surface of the interposer 150 may include conductive contacts on its bottom surface for coupling to another component (e.g., a support component 182).

In some embodiments, the metal in a DB region 130 may be used to provide power/ground planes to the components on either side of a DB region 130. For example, FIG. 29A is a side, cross-sectional view (through the section A-A of FIG. 29B) of a portion of a microelectronic assembly 100 including a DB region 130 between two microelectronic components 102-1 and 102-2 (although the same structures may be used provide power/ground planes between an interposer 150 and a microelectronic component 102 coupled thereto), and FIG. 29B is a top view of a DB interface 180 (e.g., of an interposer or microelectronic component 102) associated with the DB region 130. The DB interfaces 180 of the DB region 130 may include DB contacts 110 that together (e.g., when bonded) provide a power/ground plane 198 that may be used by the microelectronic component 102-1 and/or the microelectronic component 102-2. In particular, as shown in FIG. 29A, the DB contacts 110-1 may be electrically coupled to a power/ground plane 200-1 (e.g., a power/ground rail) by a interconnect 202 (e.g., including one or more vias and/or lines, etc.). The power/ground plane 200-1 itself may be coupled to a power/ground source (e.g., in a support component 182, not shown) via a conductive structure 194 (e.g., a TSV). The power/ground plane 198 of the DB region 130 may provide a thick, laterally extensive area that may be used for power/ground access by the microelectronic component 102-1 and/or the microelectronic component 102-2, thereby freeing up area and/or layers in the microelectronic component 102-1 and/or the microelectronic component 102-2 for these power/ground planes. Further, the achievable thickness of the power/ground plane 198 may be greater than that achievable in layers of the microelectronic components 102, and thus power/ground planes 198 in DB regions 130 may have lower resistance, and therefore better power delivery efficiency, than achievable using conventional approaches.

A DB region 130 may include multiple power/ground planes 198. For example, FIG. 29B illustrates four different parallel "striped" DB contacts 110 (labeled 110-1, 110-2, 110-3, and 110-4) above four different parallel "striped" power/ground planes 200 (labeled 200-1, 200-2, 200-3 and 200-4); the power/ground planes 200 may be part of the microelectronic component 102-1, and may be embedded in a dielectric material of the microelectronic component 102-1. Interconnects 202 may selectively couple different ones of the DB contacts 110 to different ones of the power/ground planes 200. For example, the DB contact 110-1 may be electrically coupled to the power/ground plane 200-1, the DB contact 110-2 may be electrically coupled to the power/ground planes 200-2 and 200-4, the DB contact 110-3 may be electrically coupled to the power/ground plane 200-1, and the DB contact 110-4 may be electrically coupled to the power/ground plane 200-3. In some embodiments, the power/ground plane 200-1 may be a first power plane (e.g., operating at a desired Vcc for the microelectronic component 102-1), causing the DB contacts 110-1 and 110-3 to also act as power planes (e.g., operating at the desired Vcc for the microelectronic component 102-1). In some embodiments, the power/ground planes 200-2 and 200-4 may be ground planes (e.g., providing a current return path), causing the DB contact 110-1 to also act as a ground plane (e.g., providing a current return path). In some embodiments, the power/ground plane 200-3 may be a second power plane (e.g., operating at a voltage different than the voltage of the first power plane, for example, at a desired Vcc for the microelectronic component 102-2), causing the DB contact 110-4 to also act as a second power plane (e.g., operating at the desired Vcc for the microelectronic component 102-2). Different DB contacts 110 in a DB region 130 may be arranged as part of any one or more power/ground planes 198.

Figure 30:
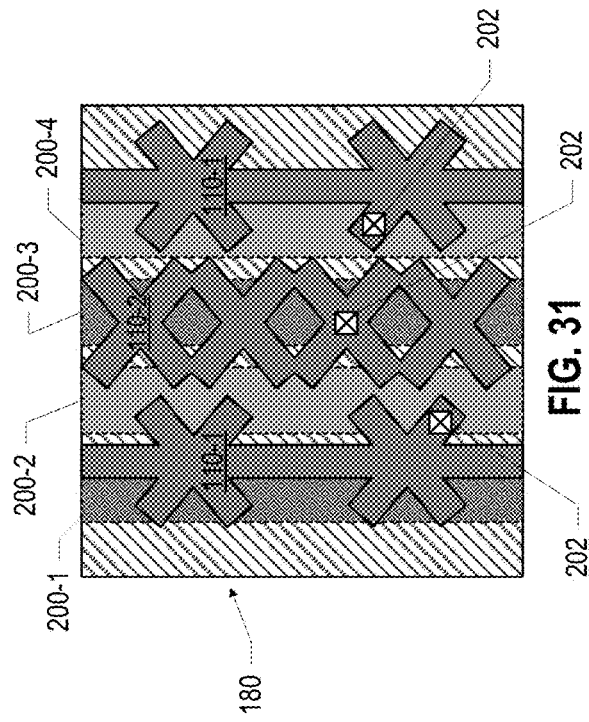
FIGS. 30-31 are top views of example portions of microelectronic assemblies with power/ground planes in the direct bonding regions, in accordance with various embodiments.
Figure 31:
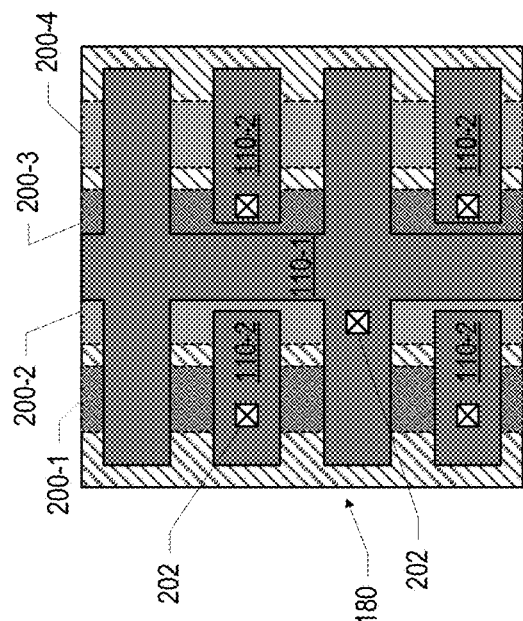
Figure 32:
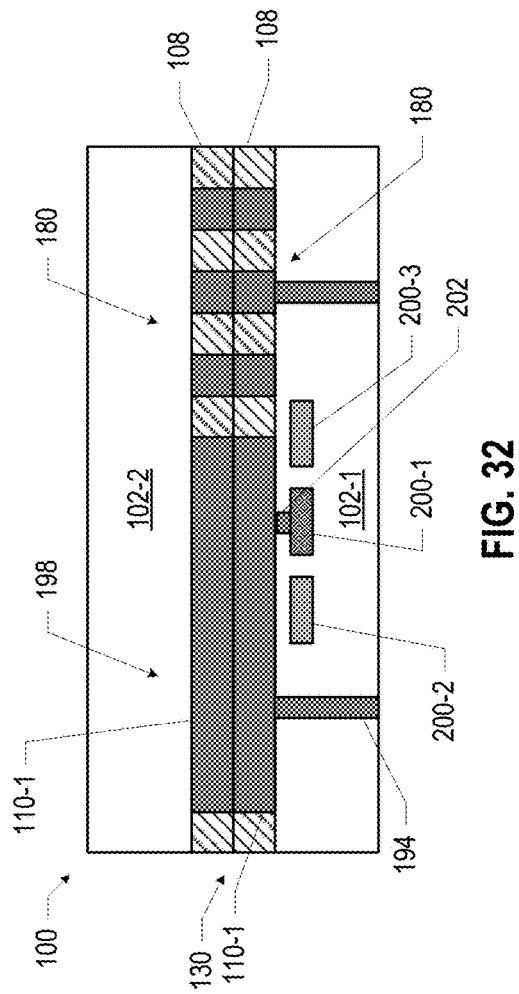
FIG. 32 is a side, cross-sectional view of an example portion of a microelectronic assembly with cantilevered power/ground planes in a direct bonding region, in accordance with various embodiments.

In the embodiment of FIG. 29B, different ones of the DB contacts 110 (part of power/ground planes 198 in the DB regions 130) are shown as being arranged in parallel stripes. This is simply illustrative, and DB contacts 110 that are part of power/ground planes 198 in a DB region 130 may have any desired shape and arrangement (e.g., rectangular or nonrectangular shapes, and regular or irregular arrangements). For example, FIGS. 30 and 31 illustrate DB contacts 110 at different DB interfaces 180 that have various shapes and arrangements, and are coupled to 200 with various arrangements of interconnects 202. As noted above, a power/ground plane 198 in a DB region 130 may be used by the microelectronic components 102 at one or both sides of a DB region 130. For example, FIG. 32 is a side view of a portion of a microelectronic assembly 100 in which the power/ground plane 198 is used to provide an electrical pathway between a conductive structure 194 (e.g., a TSV) and a power/ground plane 200-1 (via an intervening interconnect 202). In such an arrangement, the power/ground plane 198 may be said to provide a "cantilevered" pathway between the conductive structure 194 and the power/ground plane 200-1.

The microelectronic components 102 and microelectronic assemblies 100 disclosed herein may be included in any suitable electronic component. FIGS. 33-36 illustrate various examples of apparatuses that may include, or be included in, as suitable, any of the microelectronic components 102 and microelectronic assemblies 100 disclosed herein.

Figure 33:
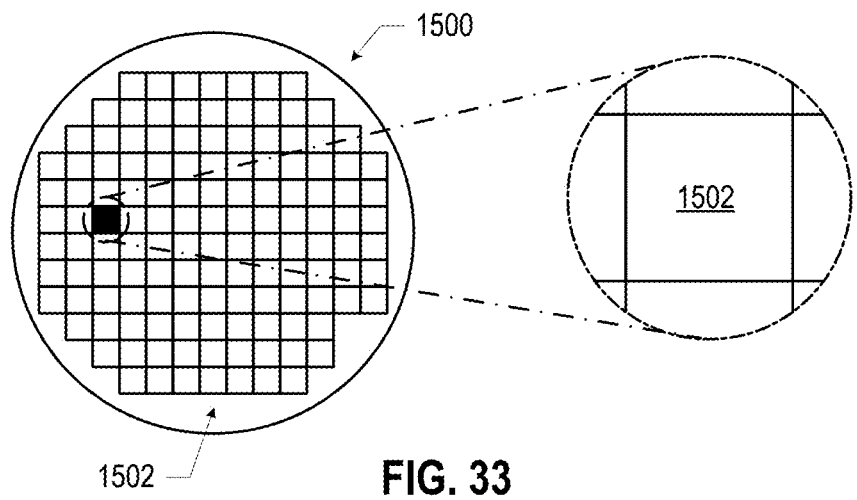
FIG. 33 is a top view of a wafer and dies that may be included in a microelectronic component in accordance with any of the embodiments disclosed herein.

FIG. 33 is a top view of a wafer 1500 and dies 1502 that may be included in any of the microelectronic components 102 disclosed herein. For example, a die 1502 may serve as a microelectronic component 102, or may be included in a microelectronic component 102. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 34, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 36) or other logic that is configured to store information in the memory devices or execute instructions stored in the memory array.

Figure 34:
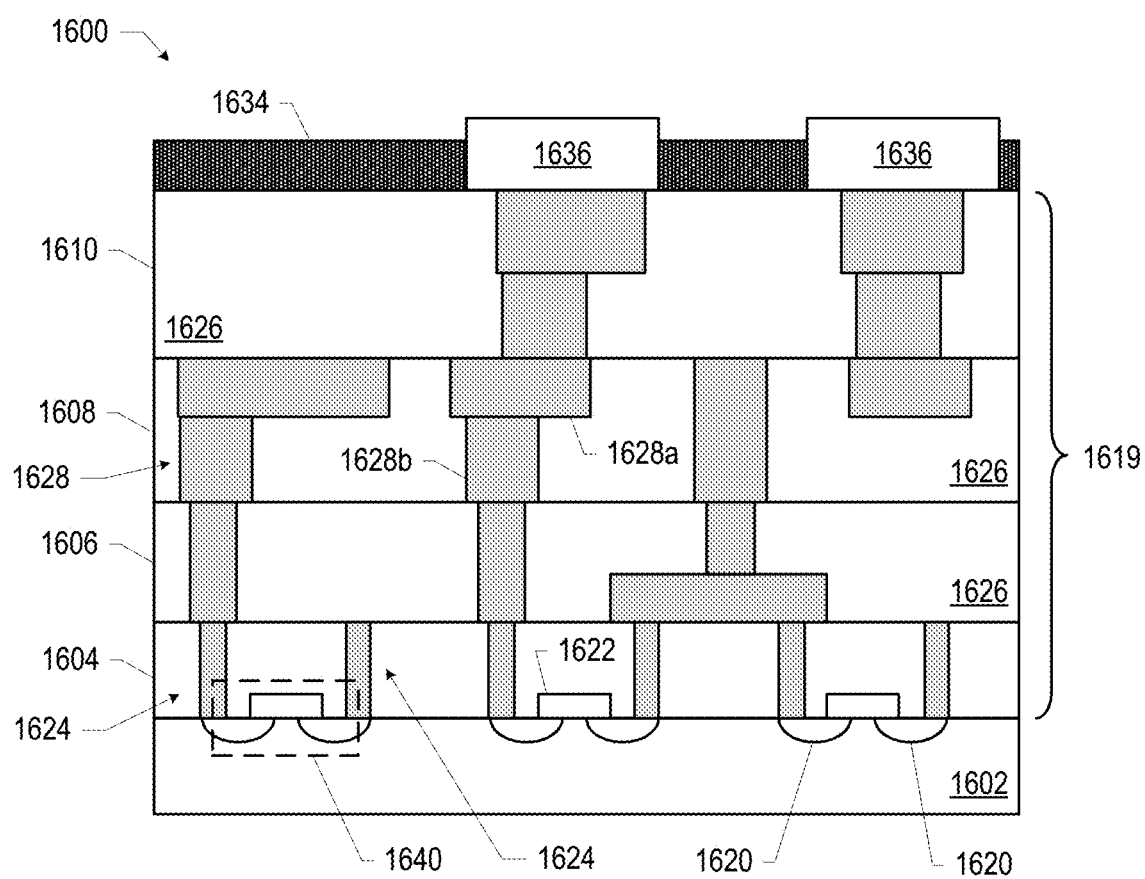
FIG. 34 is a side, cross-sectional view of an integrated circuit (IC) device that may be included in a microelectronic component in accordance with any of the embodiments disclosed herein.

FIG. 34 is a side, cross-sectional view of an IC device 1600 that may be included in any of the microelectronic components 102 disclosed herein. For example, an IC device 1600 (e.g., as part of a die 1502, as discussed above with reference to FIG. 33) may serve as a microelectronic component 102, or may be included in a microelectronic component 102. One or more of the IC devices 1600 may be included in one or more dies 1502 (FIG. 33). The IC device 1600 may be formed on a substrate 1602 (e.g., the wafer 1500 of FIG. 33) and may be included in a die (e.g., the die 1502 of FIG. 33). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 33) or a wafer (e.g., the wafer 1500 of FIG. 33).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 34 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 34 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 34). Although a particular number of interconnect layers 1606-1610 is depicted in FIG. 34, embodiments of the present disclosure include IC devices having more or fewer interconnect layers than depicted.

In some embodiments, the interconnect structures 1628 may include lines 1628*a* and/or vias 1628*b* filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 34. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 34. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 34, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 35:
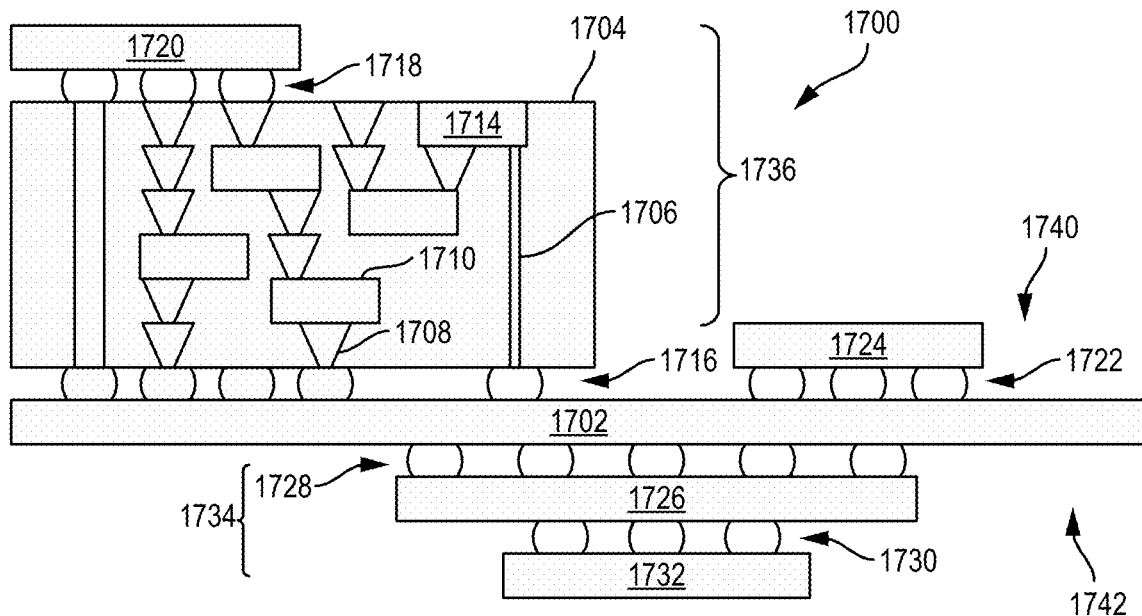
FIG. 35 is a side, cross-sectional view of an IC device assembly that may include a microelectronic assembly in accordance with any of the embodiments disclosed herein.

FIG. 35 is a side, cross-sectional view of an IC device assembly 1700 that may include any of the microelectronic components 102 and/or microelectronic assemblies 100 disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may include any of the embodiments of the microelectronic assemblies 100 disclosed herein (e.g., may include multiple microelectronic components 102 coupled together by direct bonding).

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 35 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 35), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 35, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 33), an IC device (e.g., the IC device 1600 of FIG. 34), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 35, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 35 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 36:
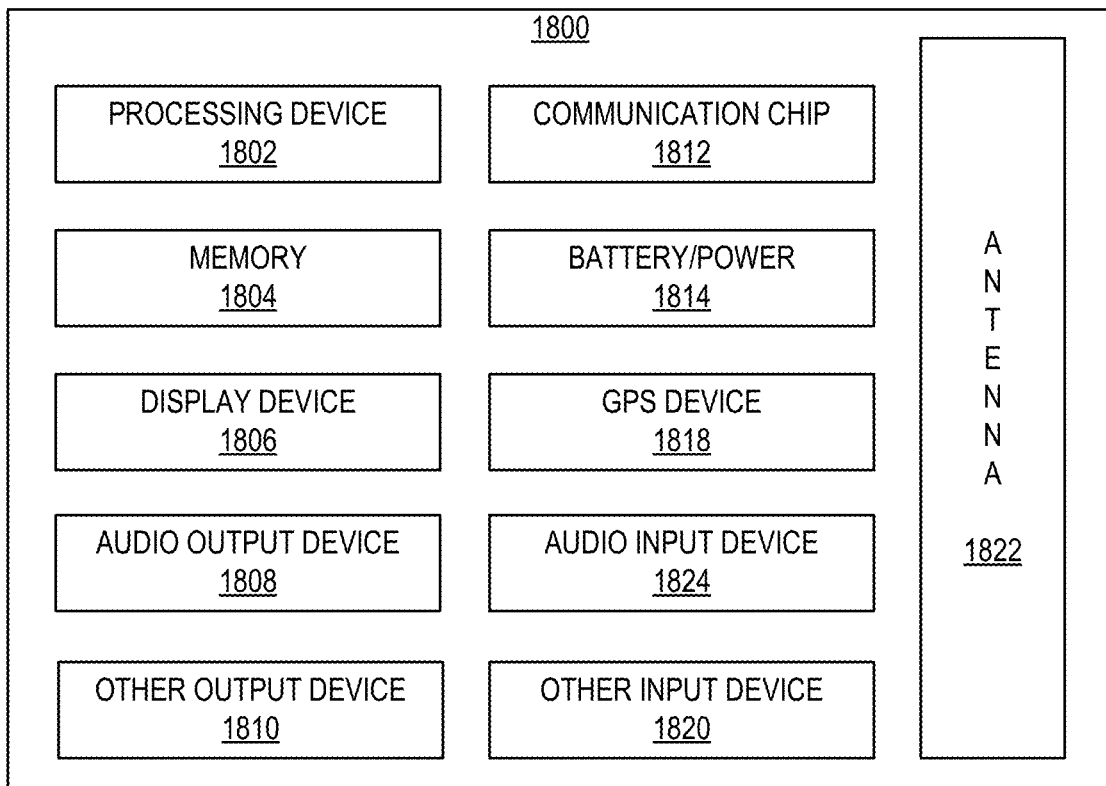
FIG. 36 is a block diagram of an example electrical device that may include a microelectronic assembly in accordance with any of the embodiments disclosed herein.

FIG. 36 is a block diagram of an example electrical device 1800 that may include any of the microelectronic components 102 and/or microelectronic assemblies 100 disclosed herein. For example, any suitable ones of the components of the electrical device 1800 may include one or more of the IC device assemblies 1700, IC devices 1600, or dies 1502 disclosed herein. A number of components are illustrated in FIG. 36 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 36, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), CPUs, graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is a microelectronic assembly, including: a first microelectronic component; and a second microelectronic component coupled to the first microelectronic component by a direct bonding region, wherein the direct bonding region includes a first subregion and a second subregion, and the first subregion has a greater metal density than the second subregion.

Example 2 includes the subject matter of Example 1, and further specifies that the first subregion includes at least one metal contact having a rectangular footprint.

Example 3 includes the subject matter of any of Examples 1-2, and further specifies that the second subregion includes at least one metal contact having a circular footprint.

Example 4 includes the subject matter of any of Examples 1-3, and further specifies that the second microelectronic component includes a memory array, and a footprint of the memory array at least partially overlaps with a footprint of the first subregion.

Example 5 includes the subject matter of Example 4, and further specifies that the memory array is a dynamic random access memory array.

Example 6 includes the subject matter of any of Examples 1-5, and further specifies that the second microelectronic component includes an amplifier, and a footprint of the amplifier at least partially overlaps with a footprint of the first subregion.

Example 7 includes the subject matter of any of Examples 1-6, and further specifies that the first subregion includes a first dielectric material, the second subregion includes a second dielectric material, and a material composition of the first dielectric material is different from a material composition of the second dielectric material.

Example 8 includes the subject matter of Example 7, and further specifies that the first dielectric material has a higher thermal conductivity than the second dielectric material.

Example 9 includes the subject matter of any of Examples 7-8, and further specifies that the first dielectric material includes silicon and nitrogen.

Example 10 includes the subject matter of any of Examples 7-9, and further specifies that the second dielectric material includes silicon and oxygen.

Example 11 includes the subject matter of any of Examples 1-10, and further specifies that the first subregion includes a first metal contact, the second subregion includes a second metal contact, and an area of the first metal contact is different than an area of the second metal contact.

Example 12 includes the subject matter of Example 11, and further specifies that the area of the first contact is greater than the area of the second metal contact.

Example 13 includes the subject matter of any of Examples 1-12, and further specifies that the first microelectronic component includes an interposer.

Example 14 includes the subject matter of Example 13, and further specifies that the interposer includes an organic dielectric material.

Example 15 includes the subject matter of any of Examples 1-13, and further specifies that the first microelectronic component or the second microelectronic component includes a die.

Example 16 includes the subject matter of Example 15, and further specifies that the die is a dummy die.

Example 17 includes the subject matter of any of Examples 1-16, and further specifies that the first microelectronic component includes a direct bonding interface in the direct bonding region, and the direct bonding interface includes metal contacts and a dielectric material between adjacent ones of the first metal contacts.

Example 18 includes the subject matter of Example 17, and further specifies that a pitch of the metal contacts is less than 20 microns.

Example 19 includes the subject matter of any of Examples 17-18, and further specifies that the metal contacts include copper.

Example 20 includes the subject matter of Example 19, and further specifies that the metal contacts also include manganese and nickel.

Example 21 includes the subject matter of any of Examples 17-20, and further specifies that the metal contacts include manganese, titanium, gold, silver, palladium, nickel, aluminum, tantalum, or cobalt.

Example 22 includes the subject matter of Example 21, and further specifies that the metal contacts include tantalum and nitrogen.

Example 23 includes the subject matter of any of Examples 21-22, and further specifies that the metal contacts include cobalt and iron.

Example 24 includes the subject matter of any of Examples 17-23, and further specifies that the metal contacts include a bulk metal region and an interface metal region, and a material composition of the interface metal region is different from a material composition of the bulk metal region.

Example 25 includes the subject matter of any of Examples 17-24, and further specifies that the metal contacts include metal pads.

Example 26 includes the subject matter of Example 25, and further specifies that the metal pads are in contact with vias, and the vias are in a buildup material of the first microelectronic component.

Example 27 includes the subject matter of any of Examples 17-26, and further specifies that the metal contacts include metal vias.

Example 28 includes the subject matter of Example 27, and further specifies that the metal vias are in the dielectric material.

Example 29 includes the subject matter of any of Examples 27-28, and further specifies that the metal vias have a non-circular footprint.

Example 30 includes the subject matter of any of Examples 27-29, and further specifies that the metal vias are in contact with metal lines in the first microelectronic component, and at least one side face of an individual metal via is aligned with a side face of an associated individual metal line.

Example 31 includes the subject matter of any of Examples 17-21, and further specifies that the dielectric material includes an inorganic dielectric material.

Example 32 includes the subject matter of Example 31, and further specifies that the inorganic dielectric material includes silicon and oxygen; silicon and nitrogen; silicon, oxygen, and nitrogen; silicon, carbon, and nitrogen; or silicon, oxygen, carbon, and nitrogen.

Example 33 includes the subject matter of any of Examples 1-32, and further specifies that the microelectronic assembly further includes a heat spreader.

Example 34 includes the subject matter of Example 33, and further specifies that the microelectronic assembly further includes a thermal interface material between the microelectronic component and the heat spreader.

Example 35 is a microelectronic assembly, including: a first microelectronic component; a second microelectronic component coupled to the first microelectronic component by a first direct bonding region at a surface of the first microelectronic component; and a third microelectronic component coupled to the first microelectronic component by a second direct bonding region at the surface of the first microelectronic component, wherein a metal trace of the first microelectronic component, coplanar with the first direct bonding region and the second direct bonding region, extends from under the second microelectronic component to under the third microelectronic component.

Example 36 includes the subject matter of Example 35, and further specifies that the metal trace is part of the first bonding region and part of the second bonding region.

Example 37 includes the subject matter of any of Examples 35-36, and further includes: a fourth microelectronic component coupled to the surface of the first microelectronic component.

Example 38 includes the subject matter of Example 37, and further specifies that the metal trace does not intersect a footprint of the fourth microelectronic component.

Example 39 includes the subject matter of any of Examples 37-38, and further specifies that the metal trace does not extend under the fourth microelectronic component.

Example 40 includes the subject matter of any of Examples 37-39, and further specifies that the fourth microelectronic component is coupled to the surface of the first microelectronic component by solder interconnects.

Example 41 includes the subject matter of any of Examples 37-39, and further specifies that the fourth microelectronic component is coupled to the first microelectronic component by a third direct bonding region at the surface of the first microelectronic component.

Example 42 includes the subject matter of Example 41, and further specifies that the first direct bonding region includes a first dielectric material, the second direct bonding region includes a second dielectric material, the third direct bonding region includes a third dielectric material, and a material composition of the first dielectric material is different from a material composition of the third dielectric material.

Example 43 includes the subject matter of Example 42, and further specifies that the first dielectric material includes silicon and nitrogen, and the third dielectric material includes silicon and oxygen.

Example 44 includes the subject matter of any of Examples 42-43, and further specifies that the first dielectric material has a higher thermal conductivity than the third dielectric material.

Example 45 includes the subject matter of any of Examples 42-44, and further specifies that the material composition of the first dielectric material is the same as a material composition of the second dielectric material.

Example 46 includes the subject matter of any of Examples 37-45, and further specifies that the metal trace is a first metal trace, and the microelectronic assembly further includes: a second metal trace, wherein the second metal trace is coplanar with the first direct bonding region and the second direct bonding region, and extends from under the second microelectronic component around a footprint of the third microelectronic component.

Example 47 includes the subject matter of any of Examples 37-46, and further specifies that the fourth microelectronic component includes a die.

Example 48 includes the subject matter of any of Examples 35-47, and further specifies that the first microelectronic component includes an interposer.

Example 49 includes the subject matter of Example 48, and further specifies that the interposer includes an organic dielectric material.

Example 50 includes the subject matter of any of Examples 35-48, and further specifies that the first microelectronic component or the second microelectronic component includes a die.

Example 51 includes the subject matter of any of Examples 35-50, and further specifies that the third microelectronic component includes a die.

Example 52 includes the subject matter of Example 51, and further specifies that the die is a dummy die.

Example 53 includes the subject matter of any of Examples 35-52, and further specifies that the first microelectronic component includes a direct bonding interface in the first direct bonding region, and the direct bonding interface includes metal contacts and a dielectric material between adjacent ones of the first metal contacts.

Example 54 includes the subject matter of Example 53, and further specifies that a pitch of the metal contacts is less than 20 microns.

Example 55 includes the subject matter of any of Examples 53-54, and further specifies that the metal contacts include copper.

Example 56 includes the subject matter of Example 55, and further specifies that the metal contacts also include manganese and nickel.

Example 57 includes the subject matter of any of Examples 53-56, and further specifies that the metal contacts include manganese, titanium, gold, silver, palladium, nickel, aluminum, tantalum, or cobalt.

Example 58 includes the subject matter of Example 57, and further specifies that the metal contacts include tantalum and nitrogen.

Example 59 includes the subject matter of any of Examples 57-58, and further specifies that the metal contacts include cobalt and iron.

Example 60 includes the subject matter of any of Examples 53-59, and further specifies that the metal contacts include a bulk metal region and an interface metal region, and a material composition of the interface metal region is different from a material composition of the bulk metal region.

Example 61 includes the subject matter of any of Examples 53-60, and further specifies that the metal contacts include metal pads.

Example 62 includes the subject matter of Example 61, and further specifies that the metal pads are in contact with vias, and the vias are in a buildup material of the first microelectronic component.

Example 63 includes the subject matter of any of Examples 53-62, and further specifies that the metal contacts include metal vias.

Example 64 includes the subject matter of Example 63, and further specifies that the metal vias are in the dielectric material.

Example 65 includes the subject matter of any of Examples 63-64, and further specifies that the metal vias have a non-circular footprint.

Example 66 includes the subject matter of any of Examples 63-65, and further specifies that the metal vias are in contact with metal lines in the first microelectronic component, and at least one side face of an individual metal via is aligned with a side face of an associated individual metal line.

Example 67 includes the subject matter of any of Examples 53-66, and further specifies that the dielectric material includes an inorganic dielectric material.

Example 68 includes the subject matter of Example 67, and further specifies that the inorganic dielectric material includes silicon and oxygen; silicon and nitrogen; silicon, oxygen, and nitrogen; silicon, carbon, and nitrogen; or silicon, oxygen, carbon, and nitrogen.

Example 69 includes the subject matter of any of Examples 35-68, and further specifies that the microelectronic assembly further includes a heat spreader.

Example 70 includes the subject matter of Example 69, and further specifies that the microelectronic assembly further includes a thermal interface material between the microelectronic component and the heat spreader.

Example 71 is a system, including: a circuit board; and a microelectronic assembly, communicatively coupled to the circuit board, wherein the microelectronic assembly includes a first microelectronic component coupled to a second microelectronic component by direct bonding contacts, and wherein the direct bonding contacts are distributed non-uniformly over an area between the first microelectronic component and the second microelectronic component.

Example 72 includes the subject matter of Example 71, and further specifies that the circuit board is a motherboard.

Example 73 includes the subject matter of any of Examples 71-72, and further specifies that the system is a handheld computing system.

Example 74 includes the subject matter of any of Examples 71-73, and further specifies that the system is a wearable computing system.

Example 75 includes the subject matter of any of Examples 71-72, and further specifies that the system is a server computing system.

Example 76 includes the subject matter of any of Examples 71-72, and further specifies that the system is a vehicular computing system.

Example 77 includes the subject matter of any of Examples 71-76, and further specifies that the system further includes a display communicatively coupled to the circuit board.

Example 78 includes the subject matter of any of Examples 71-77, and further specifies that the system further includes a wireless communication device communicatively coupled to the circuit board.

Example 79 includes the subject matter of any of Examples 71-78, and further specifies that the system further includes a housing around the microelectronic assembly and the circuit board.

The invention claimed is:
1. A microelectronic assembly, comprising:
a first microelectronic component; and
a second microelectronic component coupled to the first microelectronic component by a direct bonding region, wherein the direct bonding region includes a first subregion and a second subregion, and the first subregion has a greater metal density than the second subregion, wherein the first subregion includes a first dielectric material, the second subregion includes a second dielectric material, and a material composition of the first dielectric material is different from a material composition of the second dielectric material.

2. The microelectronic assembly of claim 1, wherein the first dielectric material has a higher thermal conductivity than the second dielectric material.

3. The microelectronic assembly of claim 1, wherein the first dielectric material includes silicon and nitrogen.

4. The microelectronic assembly of claim 1, wherein the second dielectric material includes silicon and oxygen.

5. The microelectronic assembly of claim 1, further comprising:
a circuit board communicatively coupled to the microelectronic assembly.

6. The microelectronic assembly of claim 5, wherein the circuit board is a motherboard.

7. The microelectronic assembly of claim 5, wherein the microelectronic assembly further includes a display communicatively coupled to the circuit board.

8. The microelectronic assembly of claim 1, wherein the first microelectronic component includes an interposer.

9. The microelectronic assembly of claim 1, wherein the first microelectronic component or the second microelectronic component includes a die.

10. The microelectronic assembly of claim 9, wherein the die is a dummy die.

11. A microelectronic assembly, comprising:
a first microelectronic component;
a second microelectronic component coupled to the first microelectronic component by a first direct bonding region at a surface of the first microelectronic component; and
a third microelectronic component coupled to the first microelectronic component by a second direct bonding region at the surface of the first microelectronic component, wherein a metal trace of the first microelectronic component, coplanar with the first direct bonding region and the second direct bonding region, extends from under the second microelectronic component to under the third microelectronic component.

12. The microelectronic assembly of claim 11, wherein the metal trace is part of the first direct bonding region and part of the second direct bonding region.

13. The microelectronic assembly of claim 11, further comprising:
a fourth microelectronic component coupled to the surface of the first microelectronic component.

14. The microelectronic assembly of claim 13, wherein the metal trace does not intersect a footprint of the fourth microelectronic component.

15. The microelectronic assembly of claim 13, wherein the metal trace does not extend under the fourth microelectronic component.

16. The microelectronic assembly of claim 13, wherein the fourth microelectronic component is coupled to the surface of the first microelectronic component by solder interconnects.

17. The microelectronic assembly of claim 13, wherein the fourth microelectronic component is coupled to the first microelectronic component by a third direct bonding region at the surface of the first microelectronic component.

18. The microelectronic assembly of claim 17, wherein the first direct bonding region includes a first dielectric material, the second direct bonding region includes a second dielectric material, the third direct bonding region includes a third dielectric material, and a material composition of the first dielectric material is different from a material composition of the third dielectric material.

* * * * *